(12) United States Patent
Mikkola et al.

(10) Patent No.: US 9,485,079 B2
(45) Date of Patent: Nov. 1, 2016

(54) FREQUENCY DIVISION

(75) Inventors: Niko Mikkola, Tampere (FI); Petri Heliö, Tampere (FI); Paavo Väänänen, Nokia (FI)

(73) Assignee: ST-Ericsson SA, Plan-les-Ouates (CH)

( * ) Notice: Subject to any disclaimer, the term of this patent is extended or adjusted under 35 U.S.C. 154(b) by 114 days.

(21) Appl. No.: 14/236,431

(22) PCT Filed: Aug. 2, 2012

(86) PCT No.: PCT/EP2012/065204
§ 371 (c)(1),
(2), (4) Date: Mar. 31, 2014

(87) PCT Pub. No.: WO2013/020900
PCT Pub. Date: Feb. 14, 2013

(65) Prior Publication Data
US 2014/0211895 A1 Jul. 31, 2014

Related U.S. Application Data

(60) Provisional application No. 61/523,544, filed on Aug. 15, 2011.

(30) Foreign Application Priority Data

Aug. 5, 2011 (EP) .................................... 11176724

(51) Int. Cl.
| | | |
|---|---|---|
| *H03K 21/00* | (2006.01) | |
| *H03K 23/00* | (2006.01) | |
| *H03K 25/00* | (2006.01) | |
| *H04L 7/00* | (2006.01) | |
| *H03K 23/66* | (2006.01) | |
| *H03K 23/68* | (2006.01) | |

(52) U.S. Cl.
CPC ........... *H04L 7/0008* (2013.01); *H03K 23/667* (2013.01); *H03K 23/68* (2013.01)

(58) Field of Classification Search
CPC ............... H03K 23/68; H03K 23/667; H03K 5/00006; G06F 7/68; G06F 1/08
USPC ............................... 327/115, 117; 377/47–48
See application file for complete search history.

(56) References Cited

U.S. PATENT DOCUMENTS

| | | |
|---|---|---|
| 5,018,170 A | 5/1991 | Wilson |
| 7,492,852 B1 | 2/2009 | Liu |

(Continued)

FOREIGN PATENT DOCUMENTS

| | | | |
|---|---|---|---|
| JP | 01036218 A | * | 2/1989 |
| JP | 03106124 A | * | 5/1991 |
| JP | 2004023599 A | * | 1/2004 |

OTHER PUBLICATIONS

International Search Report, International Application No. PCT/EP2012/065204. Date of mailing: Dec. 4, 2012. European Patent Office, Rijswijk, Netherlands.

*Primary Examiner* — Quan Tra
(74) *Attorney, Agent, or Firm* — Coats & Bennett, PLLC

(57) ABSTRACT

A frequency divider comprises a signal generation stage arranged to employ a clock at a clock frequency to provide a first reference signal and a second reference signal, the second reference signal corresponding to the first reference signal delayed by half a period of the clock signal. A synchronization stage is arranged to generate an output signal having an output frequency divided from the clock frequency by switching between the first reference signal and the second reference signal once per cycle of the output signal.

19 Claims, 27 Drawing Sheets

(56) References Cited

U.S. PATENT DOCUMENTS

2004/0036513 A1* 2/2004 Gibbons ................ 327/117
2005/0088210 A1* 4/2005 Chen ..................... 327/115
2005/0110581 A1 5/2005 Ngo
2005/0258879 A1* 11/2005 Marutani ............... 327/117
2006/0139075 A1 6/2006 Minzoni

* cited by examiner

| Division Ratio | 2 | 3 | 3 | 4 | 4 | 4 | 5 | 5 | 5 | 5 | 6 | 6 | 6 | 7 | 7 | 8 |
|---|---|---|---|---|---|---|---|---|---|---|---|---|---|---|---|---|
| Duty Cycle (%) | 50 | 33 | 67 | 25 | 50 | 75 | 20 | 40 | 60 | 80 | 33 | 50 | 67 | 43 | 57 | 50 |
| Switch Control Signals X8 | 0 | 0 | 0 | 0 | 0 | 0 | 1 | 0 | 0 | 0 | 1 | 0 | 0 | 1 | 0 | 1 |
| X7 | 0 | 0 | 0 | 1 | 0 | 0 | 1 | 1 | 0 | 0 | 1 | 1 | 0 | 1 | 1 | 1 |
| X6 | 0 | 1 | 0 | 1 | 1 | 0 | 1 | 1 | 1 | 0 | 1 | 1 | 1 | 1 | 1 | 1 |
| X5 | 1 | 1 | 1 | 0 | 0 | 1 | 0 | 0 | 1 | 1 | 1 | 1 | 1 | 1 | 1 | 1 |
| X4 | 0 | 0 | 0 | 1 | 0 | 0 | 1 | 0 | 0 | 0 | 0 | 0 | 0 | 0 | 0 | 0 |
| X3 | 1 | 1 | 1 | 1 | 1 | 0 | 1 | 1 | 0 | 0 | 1 | 0 | 0 | 0 | 0 | 0 |
| X2 | 1 | 1 | 1 | 1 | 1 | 1 | 1 | 1 | 1 | 0 | 1 | 1 | 0 | 0 | 0 | 0 |
| X1 | 1 | 1 | 1 | 1 | 1 | 1 | 1 | 1 | 1 | 0 | 1 | 1 | 0 | 1 | 0 | 0 |

FIG.15

| WCDMA Band | Rx frequency (MHz) | | Division by $2^M$ | | | Division by L | |
|---|---|---|---|---|---|---|---|
| | | | M | VCO frequency (MHz) | | L | VCO frequency (MHz) |
| 1 | 2110 | 2170 | 4 | 8440 | 8680 | 2.5 | 5275 | 5425 |
| 2 | 1930 | 1990 | 4 | 7720 | 7960 | 3.0 | 5790 | 5970 |
| 3 | 1805 | 1880 | 4 | 7220 | 7520 | 3.0 | 5415 | 5640 |
| 4 | 2110 | 2155 | 4 | 8440 | 8620 | 2.5 | 5275 | 5387.5 |
| 5 | 869 | 894 | 8 | 6952 | 7152 | 6.5 | 5648.5 | 5811 |
| 6 | 875 | 885 | 8 | 7000 | 7080 | 6.0 | 5250 | 5310 |
| 7 | 2620 | 2690 | 2 | 5240 | 5380 | 2.0 | 5240 | 5380 |
| 22 | 3510 | 3600 | 2 | 7020 | 7200 | 1.5 | 5265 | 5400 |

FIG. 26

FREQUENCY DIVISION

FIELD OF THE DISCLOSURE

The present disclosure relates to a frequency divider, a frequency synthesiser comprising the frequency divider, a wireless communication apparatus comprising the frequency divider, and a method of frequency division.

BACKGROUND TO THE DISCLOSURE

A key building block found in many wireless transceivers is a frequency synthesiser, which produces a local oscillator signal for up-converting a signal to be transmitted and/or down-converting a received signal. The number of frequency bands that a wireless transceiver needs to support has increased, and consequently the frequency range that a frequency synthesiser needs to cover has also increased.

In order to cover the increased frequency range, a frequency synthesiser can use a voltage controlled oscillator (VCO) or a digitally controlled oscillator (DCO) with a wider tuning range. However, widening the tuning range of a VCO or DCO degrades the quality of the local oscillator signal generated by the frequency synthesiser. An alternative to widening the tuning range of a VCO or DCO is to use multiple VCOs or DCOs each having different and smaller tuning ranges. However, this increases the silicon area required for integrating the frequency synthesiser in an integrated circuit.

Operation at increasingly higher frequencies is facilitated by the reduction in the gate length of silicon processes. However, as a smaller gate length is employed, the isolation between frequency synthesiser and other transmitter or receiver circuits becomes more critical. Simply dividing an oscillator signal by a power of two, for example by two, four or eight, may not provide an adequate basis for optimising the frequency range of a frequency synthesiser, and may not provide sufficient isolation between the frequency synthesiser and other transmitter or receiver circuits.

SUMMARY OF THE PREFERRED EMBODIMENTS

According to a first aspect, there is provided a frequency divider comprising: a signal generation stage arranged to employ a clock signal at a clock frequency to provide a first reference signal and a second reference signal, the second reference signal corresponding to the first reference signal delayed by half a period of the clock signal; and a synchronisation stage arranged to generate an output signal having an output frequency divided from the clock frequency by switching between the first reference signal and the second reference signal once per cycle of the output signal.

According to a second aspect, there is provided a method of frequency division comprising: employing a clock signal at a clock frequency to provide a first reference signal and a second reference signal, the second reference signal corresponding to the first reference signal delayed by half a period of the clock signal; and generating an output signal having an output frequency divided from the clock frequency by switching between the first reference signal and the second reference signal once per cycle of the output signal.

By switching between the first and second reference signals once per cycle of the output signal, the output signal, having a frequency divided from the frequency of the clock signal, can be generated with low complexity, with a division ratio that has a non-integer value, and the output signal can have a period that is a desired multiple of half the period of the clock signal. Each cycle of the output signal can have an identical waveform, which corresponds to a constant duty cycle, and be synchronised to the clock signal, thereby providing a low noise output signal having a noise level dependent on the noise level of the clock signal, without additional noise being introduced by the division.

In one embodiment, the frequency divider may comprise a mode control stage coupled to an output of the frequency divider for generating a selection signal indicative of the completion of each cycle of the output signal, and the switching between the first reference signal and the second reference signal may be responsive to the selection signal. Likewise, the method may comprise generating a selection signal indicative of the completion of each cycle of the output signal and switching between the first reference signal and the second reference signal responsive to the selection signal. This feature provides a low complexity way of generating the selection signal for switching the frequency divider between the first reference signal and the second reference signal, and in particular facilitates division by a non-integer division ratio N.5 where N is an integer greater than or equal to unity, and enables the output signal to have low noise, being synchronised to the clock signal. By switching once per cycle of the output signal, a constant duty cycle can be provided in each cycle, also contributing to the output signal having a low noise. The mode control stage may comprise a divide-by-two stage for generating the selection signal having a frequency equal to half of the output frequency. Likewise, the method may comprise generating the selection signal having a frequency equal to half the output frequency by dividing the output frequency by two. This provides a low complexity way of generating the selection signal.

In another embodiment, the frequency divider may comprise a mode control stage coupled to the signal generation stage for generating a selection signal indicative of the completion of each cycle of the first reference signal, and the switching between the first reference signal and the second reference signal may be responsive to the selection signal. Likewise, the method may comprise generating a selection signal indicative of the completion of each cycle of the first reference signal and switching between the first reference signal and the second reference signal responsive to the selection signal. This feature provides another low complexity way of generating the selection signal for switching the frequency divider between the first reference signal and the second reference signal, and in particular facilitates division by a division ratio midway between two integer values greater than one, in particular a non-integer division ratio of N.5 where N is an integer greater than unity, and enables the output signal to have low noise, being synchronised to the clock signal. By switching once per cycle of the first reference signal, a constant duty cycle can be provided in each cycle of the output signal, also contributing to the output signal having a low noise. The mode control stage may comprise a divide-by-two stage for generating the selection signal having a frequency equal to half of a frequency of the first reference signal. Likewise, the method may comprise generating the selection signal having a frequency equal to half the output frequency by dividing the output frequency by two. This provides a low complexity way of generating the selection signal.

Indeed, the divide-by-two stage has application where the second reference signal corresponds to the first reference signal delayed by a period other than half a period of the clock.

Therefore, according to a third aspect, there is provided a frequency divider comprising: a signal generation stage arranged to employ a clock signal at a clock frequency to provide a first reference signal and a second reference signal, the second reference signal corresponding to the first reference signal delayed by a constant time interval; a synchronisation stage arranged to generate an output signal having an output frequency divided from the clock frequency by switching between the first reference signal and the second reference signal once per cycle of the output signal in response to a selection signal indicative of the completion of each cycle of the output signal; and a divide-by-two stage coupled to an output of the frequency divider for generating the selection signal having a frequency equal to half of the output frequency.

Likewise, according to a fourth aspect there is provided a method of frequency division comprising: employing a clock signal at a clock frequency to provide a first reference signal and a second reference signal, the second reference signal corresponding to the first reference signal delayed by a constant time interval; generating an output signal having an output frequency divided from the clock frequency by switching between the first reference signal and the second reference signal once per cycle of the output signal in response to a selection signal indicative of the completion of each cycle of the output signal; and employing a divide-by-two stage for generating the selection signal having a frequency equal to half of the output frequency.

According to a fifth aspect, there is provided a frequency divider comprising: a signal generation stage arranged to employ a clock signal at a clock frequency to provide a first reference signal and a second reference signal, the second reference signal corresponding to the first reference signal delayed by a reference time interval; a synchronisation stage arranged to generate an output signal having an output frequency divided from the clock frequency by switching between the first reference signal and the second reference signal once per cycle of the output signal in response to a selection signal indicative of the completion of each cycle of the first reference signal; and a divide-by-two stage coupled to an output of the frequency divider for generating the selection signal having a frequency equal to half of the frequency of the first reference signal.

Likewise, according to a sixth aspect there is provided a method of frequency division comprising: employing a clock signal at a clock frequency to provide a first reference signal and a second reference signal, the second reference signal corresponding to the first reference signal delayed by a reference time interval; generating an output signal having an output frequency divided from the clock frequency by switching between the first reference signal and the second reference signal once per cycle of the output signal in response to a selection signal indicative of the completion of each cycle of the first reference signal; and employing a divide-by-two stage for generating the selection signal having a frequency equal to half of the frequency of the first reference signal.

The first reference signal may be the clock signal. In this case the second reference signal corresponds to an inversion of the clock signal, which can be readily provided in a precise manner synchronised to the clock signal, for example by use of an inverter circuit or a differential circuit, thereby contributing to low noise in the output signal.

The synchronisation stage may be arranged to generate the output signal comprising, alternately, portions of the first and second reference signals spaced apart by half a period of the clock signal during which time the ultimate level of the previous one of the portions is maintained. This feature is advantageous, in particular, where the first reference signal is the clock signal, as it enables the frequency divider to have a low complexity.

The signal generation stage may comprise a division stage for generating the first reference signal by dividing the clock signal by an integer division ratio. Likewise, the method may comprise generating the first reference signal by dividing the clock signal by an integer division ratio. This can provide flexibility over the division ratio and duty cycle provided by the frequency divider.

The division stage may be arranged to alternately increase and decrease the integer division ratio in response to the selection signal. Likewise, the method may comprise alternately increasing and decreasing the integer division ratio in response to the selection signal. This enables division by a division ratio having a value midway between the two integer division ratios.

The division stage may comprise: a clocked delay line having a plurality of delay stages coupled in series; a feedback controller coupled between an input of the clocked delay line and outputs of one or more of the delay stages and arranged to provide a periodic input signal to the input of the clocked delay line, wherein each period of the input signal is dependent on signals at respective outputs of the one or more of the delay stages; an output of the clocked delay line coupled to an output of one of the delay stages for delivering the first reference signal; and a delay means coupled to the one, or another, of the delay stages for generating the second reference signal corresponding to the delayed first reference signal; wherein the feedback controller is arranged to alternately increase and decrease the integer division ratio in response to the selection signal by selecting the one or more of the delay stages from the plurality of delay stages.

Likewise, the method may comprise: providing a clocked delay line having a plurality of delay stages coupled in series; providing a periodic input signal to an input of the clocked delay line, wherein each period of the input signal is dependent on signals at respective outputs of one or more of the delay stages; delivering the first reference signal from an output of one of the delay stages; generating the second reference signal by delaying the first reference signal; and alternately increasing and decreasing the integer division ratio in response to the selection signal by selecting the one or more of the delay stages from the plurality of delay stages.

This enables the output signal to have a desired division ratio. In particular, the output signal can have a 50% duty cycle even for integer division ratios having an odd value. For example, division by three can provide the output signal having a period equal to three cycles of the clock signal, and a 50% duty cycle can be provided with each half cycle occupying one and a half cycles of the clock signal In another embodiment, the division stage may comprise: a clocked delay line having a plurality of delay stages coupled in series, wherein the delay stages occupying odd numbered positions in the clocked delay line are arranged to be clocked by the clock signal and the delay stages occupying even numbered positions in the clocked delay line are arranged to be clocked by an inverse clock signal corresponding to an inversion of the clock signal; a feedback controller coupled between an input of the clocked delay line and outputs of one or more of the delay stages and arranged to provide a periodic input signal to the input of the clocked delay line, wherein each period of the input signal is dependent on signals at respective outputs of the one or more of the delay stages; a first output of the clocked delay line coupled to an output of one of the delay stages for delivering the first reference signal; and a second output of the clocked delay line coupled to another one of the delay stages for delivering the second reference signal; wherein the feedback controller is arranged to alternately increase and decrease the integer division ratio in response to the selection signal by selecting the one or more of the delay stages from the plurality of delay stages.

Likewise, the method may comprise: providing a clocked delay line having a plurality of delay stages coupled in series, clocking the delay stages occupying odd numbered positions in the clocked delay line with the clock signal and the delay stages occupying even numbered positions in the clocked delay line with an inverse clock signal corresponding to an inversion of the clock signal; providing a periodic input signal to an input of the clocked delay line, wherein each period of the input signal is dependent on signals at respective outputs of one or more of the delay stages; delivering the first reference signal from an output of one of the delay stages; delivering the second reference signal from an output of another one of the delay stages; and alternately increasing and decreasing the integer division ratio in response to the selection signal by selecting the one or more of the delay stages from the plurality of delay stages. This enables generation of the first and second reference signals, and alternate increasing and decreasing of the integer division ratio, in a low complexity manner.

Indeed, the division stage may be employed in other applications requiring an integer division ratio. Therefore, according to a seventh aspect, there is provided a frequency divider comprising: a clocked delay line having a plurality of delay stages coupled in series; a feedback controller coupled between an input of the clocked delay line and outputs of at least two of the delay stages and arranged to provide a periodic input signal to the input of the clocked delay line, wherein each period of the input signal is dependent on signals at respective outputs of the at least two of the delay stages.

According to an eighth aspect, there is provided a frequency divider comprising: a clocked delay line having a plurality of delay stages coupled in series, wherein the delay stages occupying odd numbered positions in the clocked delay line are arranged to be clocked by the clock signal and the delay stages occupying even numbered positions in the clocked delay line are arranged to be clocked by an inverse clock signal corresponding to an inversion of the clock signal; a feedback controller coupled between an input of the clocked delay line and outputs of at least two of the delay stages and arranged to provide a periodic input signal to the input of the clocked delay line, wherein each period of the input signal is dependent on signals at respective outputs of the at least two of the delay stages.

Each of the plurality of delay stages may comprise a tri-state inverter circuit. This enables the delay stages to have low complexity and a low power consumption.

The alternate increase and decrease of the integer division ratio in response to the selection signal may be an alternate increase and decrease of the integer division ratio by unity. This enables division by a non-integer division ratio having a value midway between two consecutive integer values.

The feedback controller may comprise: a first pair of switches comprising a first controller switch and a second controller switch coupled in parallel, a second pair of switches comprising a third controller switch and a fourth controller switch coupled in parallel, a third pair of switches comprising a fifth controller switch and a sixth controller switch coupled in parallel, and a fourth pair of switches comprising a seventh controller switch and an eighth controller switch coupled in parallel, wherein the first and second pairs of switches are coupled in a series arrangement between a first voltage rail and the input of the clocked delay line, and the third and fourth pairs of switches are coupled in a series arrangement between a second voltage rail and the input of the clocked delay line; wherein at least one of the first, third, fifth and seventh controller switches are arranged to be switched dependent on a required division ratio of the division stage, and wherein the second, fourth, sixth and eighth controller switches are arranged to be switched dependent on respective outputs of respective delay stages of the clocked delay line. This enables the switching of the division ratio to be synchronised to the selection signal in a low complexity and low power manner and at high speed.

Indeed, the feedback controller can have application where generation of the output signal does not require switching between the first reference signal and the second reference signal once per cycle of the output signal, for example, in a frequency divider having a selectable output frequency and/or a selectable output duty cycle for the output signal. Therefore, according to a ninth aspect there is provided a frequency divider comprising: a division stage for providing an output signal having an output frequency by dividing a clock signal at a clock frequency, wherein the division stage comprises a clocked delay line having a plurality of delay stages coupled in series; a feedback controller arranged to select the output frequency and/or a duty cycle of the output signal, wherein the feedback controller comprises: a first pair of switches comprising a first controller switch and a second controller switch coupled in parallel, a second pair of switches comprising a third controller switch and a fourth controller switch coupled in parallel, a third pair of switches comprising a fifth controller switch and a sixth controller switch coupled in parallel, and a fourth pair of switches comprising a seventh controller switch and an eighth controller switch coupled in parallel, wherein the first and second pairs of switches are coupled in a series arrangement between a first voltage rail and the input of the clocked delay line, and the third and fourth pairs of switches are coupled in a series arrangement between a second voltage rail and the input of the clocked delay line; wherein at least one of the first, third, fifth and seventh controller switches are arranged to be switched dependent on a required division ratio of the division stage, and wherein the second, fourth, sixth and eighth controller switches are arranged to be switched dependent on respective outputs of respective delay stages of the clocked delay line.

The first, second, third and fourth controller switches can comprise n-channel metal oxide silicon (NMOS) transistors and the fifth, sixth, seventh and eighth controller switches can comprise p-channel metal oxide silicon (PMOS) transistors. This enables a low complexity, low power implementation.

The synchronisation stage may comprise: first, third and fifth synchronisation switches coupled in a series arrangement between a/the first voltage rail and the output of the frequency divider; second, fourth and sixth synchronisation switches coupled in a series arrangement between the first voltage rail and the output of the frequency divider; seventh, ninth and eleventh synchronisation switches coupled in a series arrangement between the output of the frequency divider and a/the second voltage rail; eighth, tenth and twelfth synchronisation switches coupled in a series arrangement between the output of the frequency divider and a/the second voltage rail; wherein, in a first state: the first and twelfth synchronisation switches are switched in response to the selection signal; the second and eleventh synchronisation switches are switched in response to an inverse of the selection signal; the third and tenth synchronisation switches are switched in response to the clock signal; the fourth and ninth synchronisation switches are switched in response to the inverse clock signal; the fifth and seventh synchronisation switches are switched in response to the first reference signal; and the sixth and eighth synchronisation switches are switched in response to the second reference signal. This enables the switching between the first and second reference signals, synchronised to transitions in the selection signal, to be implemented with low complexity. The first state may be division by the frequency divider by a non-integer division ratio, in particular a division ratio N.5 where N is an integer greater than unity.

In a second state: the second and eleventh synchronisation switches are switched in response to the selection signal; the first and the twelfth synchronisation switches are switched in response to an inverse of the selection signal; the third, ninth and tenth synchronisation switches are switched in response to the clock signal; the fourth synchronisation switch is switched in response to the inverse clock signal; the fifth, sixth and eighth synchronisation switches are switched in response to the first reference signal; and the seventh synchronisation switch is switched in response to the second reference signal. This enables the switching between the first and second reference signals, synchronised to transitions in the selection signal, to be implemented with low complexity.

Alternatively, in the second state: the first and twelfth synchronisation switches are switched in response to the selection signal; the second and eleventh synchronisation switches are switched in response to an inverse of the selection signal; the fourth synchronisation switch is switched in response to the clock signal; the third, ninth and tenth synchronisation switches are switched in response to the inverse clock signal; the seventh synchronisation switch is switched in response to the first reference signal; and the fifth, sixth and eighth synchronisation switches are switched in response to the second reference signal. This also enables the switching between the first and second reference signals, synchronised to transitions in the selection signal, to be implemented with low complexity.

The first, second, third, fourth, fifth and sixth synchronisation switches may comprise n-channel metal oxide silicon, NMOS, transistors and the seventh, eighth, ninth, tenth, eleventh and twelfth synchronisation switches may comprise p-channel metal oxide silicon, PMOS, transistors. This enables a low complexity, low power implementation.

In another embodiment, the first reference signal may be the clock signal, the synchronisation stage may be arranged to generate an intermediate signal by switching between the first reference signal and the second reference signal once per cycle of the output signal, and the synchronisation stage may comprise a division stage for generating the output signal by dividing the intermediate signal by an integer division ratio. Likewise, the method may comprise, in which the first reference signal may be the clock signal, generating an intermediate signal by switching between the first reference signal and the second reference signal once per cycle of the output signal, and generating the output signal by dividing the intermediate signal by an integer division ratio. This provides another low complexity way of dividing by a non-integer division ratio N.5 where N is an integer greater than unity, also enabling the output signal to have a low noise, being synchronised to the clock signal. In another embodiment, the synchronisation stage may comprises a first tri-state inverter for selecting the first reference signal, a second tri-state inverter for selecting the second reference signal, a third tri-state inverter for synchronising the selecting of the first reference signal to a transition of the clock signal, and a fourth tri-state inverter for synchronising the selecting of the second reference signal to an opposite transition of the clock signal. This provides low complexity, low power consumption and low noise.

According to another aspect, there is provided a frequency synthesiser comprising the frequency divider. According to a further aspect, there is provided a wireless communication apparatus comprising the frequency divider.

BRIEF DESCRIPTION OF THE DRAWINGS

Preferred embodiments will now be described, by way of example only, with reference to the accompanying drawings, in which:

FIG. 15 is a table showing division ratios and duty cycles available from the division stage by using the feedback controller of FIG. 14;

FIG. 26 is a table showing example division ratios for a range of radio frequencies.

DETAILED DESCRIPTION OF PREFERRED EMBODIMENTS

Figure 1:
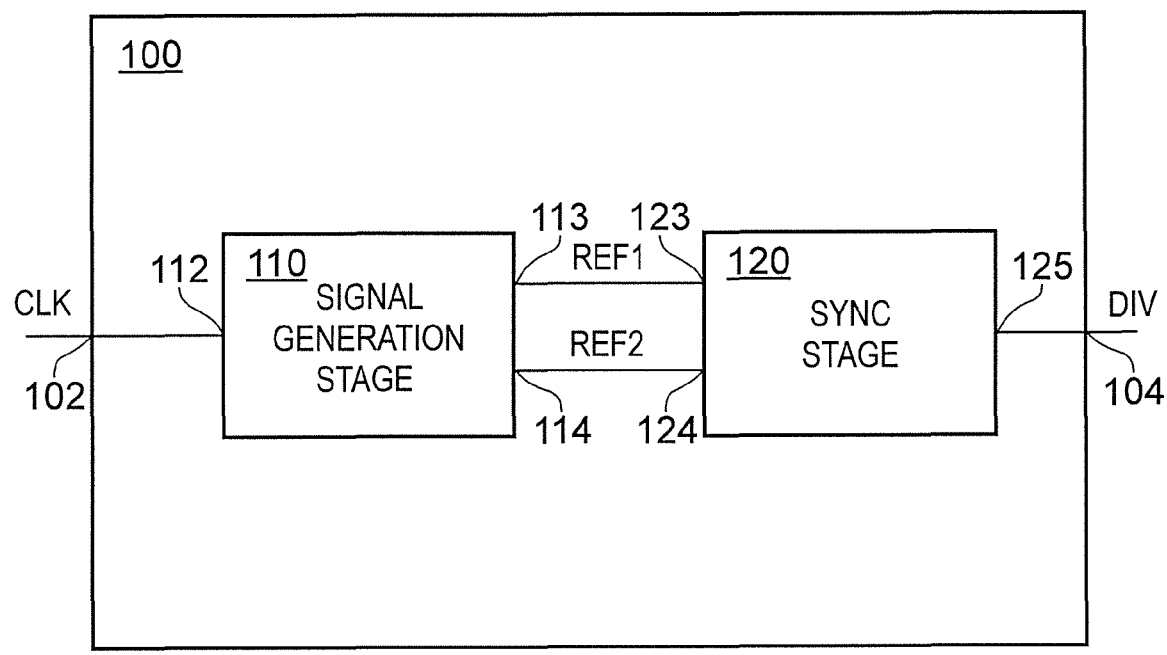
FIG. 1 is a schematic diagram of a frequency divider.

Referring to FIG. 1, a frequency divider 100 comprises a signal generation stage 110 and a synchronisation stage 120. There is an input 102 of the frequency divider 100 for receiving a clock signal CLK having a clock frequency, and an output 104 of the frequency divider 100 for delivering an output signal DIV having an output frequency divided from the clock signal CLK. In other embodiments the clock signal CLK may be generated within the frequency divider 100.

The input 102 of the frequency divider 100 is coupled to a first input 112 of the signal generation stage 110. The signal generation stage 110 employs the clock signal CLK to produce a first reference signal REF1 at a first reference output 113 of the signal generation stage 110 and a second reference signal REF2 at a second reference output 114 of the signal generation stage 110. The second reference signal REF2 is equal to the first reference signal REF1 delayed by half a period of the clock signal. The first reference output 113 is coupled to a first reference input 123 of the synchronisation stage 120, and the second reference output 114 of the signal generation stage 110 is coupled to a second reference input 124 of the synchronisation stage 120. The synchronisation stage 120 employs the first reference signal REF1 and the second reference signal REF2 to produce the output signal DIV at a signal output 125 of the synchronisation stage 120, which is coupled to the output 104 of the frequency divider 100, by switching between the first reference signal REF1 and the second reference signal REF2 once per cycle of the output signal DIV.

By appropriate choice of the first and second reference signals REF1, REF2, the output frequency and/or the duty cycle of the output signal DIV can be selected. In general, the first reference signal REF1, and consequently also the second reference signal REF2, is derived from the clock signal CLK by division by a division ratio, although in some embodiments the first reference signal REF1 is equal to the clock signal CLK, and consequently the second reference signal REF2 is, in effect, equal to an inverse clock signal −CLK, which corresponds to the clock signal CLK delayed by half a period of the clock signal CLK, where the clock signal has a duty cycle of 50%. Such embodiments may be regarded as using a division ratio of unity to derive the first reference signal REF1 from the clock signal CLK, in which case the division is trivial and so the division may be omitted.

Features described above with reference to FIG. 1 are described in more detail below by means of further examples.

Figure 2:
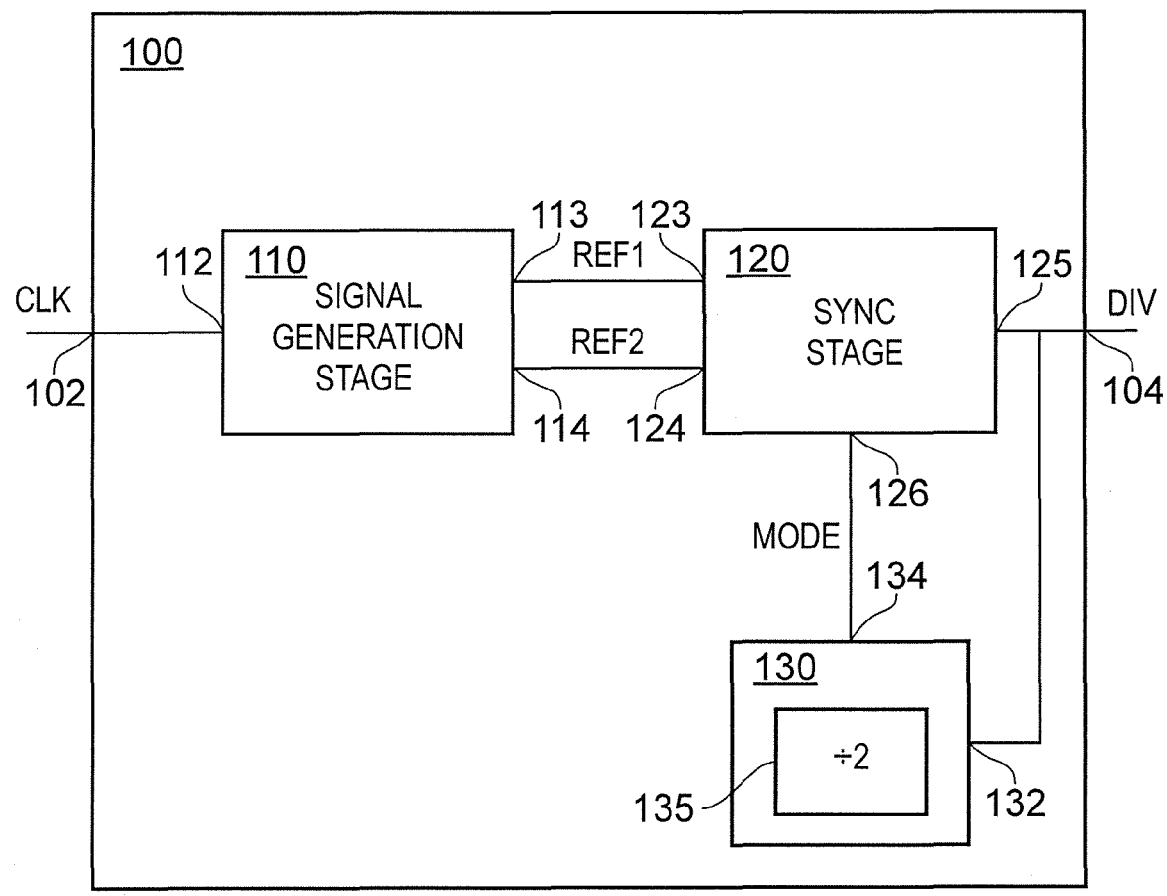
FIG. 2 is a schematic diagram of a frequency divider illustrating one way of providing the selection signal, in particular for division by N.5 where N is an integer greater than or equal to unity.

The switching between the first and second reference signals REF1, REF2 once per cycle of the output signal DIV can be responsive to a selection signal MODE. Referring to FIG. 2, there is illustrated a frequency divider 100 having the elements illustrated in, and described with reference to, FIG. 1, but additionally comprising a mode control stage 130 having a first input 132 coupled to the signal output 125 of the synchronisation stage 120, or equivalently to the output 104 of the frequency divider 100, for receiving the output signal DIV, and having a first output 134 coupled to a mode control input 126 of the synchronisation stage 120 for delivering the selection signal MODE to the synchronisation stage 120. The selection signal MODE is indicative of the completion of each cycle of the output signal DIV. This arrangement of the mode control stage 130 is suitable, in particular, when the output frequency is divided from the clock frequency by a division ratio of N.5 where N is an integer greater than unity, and in particular a division ratio of 1.5. The mode control stage 130 can comprise, for example, a divide-by-two stage 135 for dividing the output signal DIV by two. In this way, the selection signal MODE has a frequency equal to half the output frequency, with transitions in the selection signal MODE occurring once per cycle of the output signal DIV.

Figure 3:
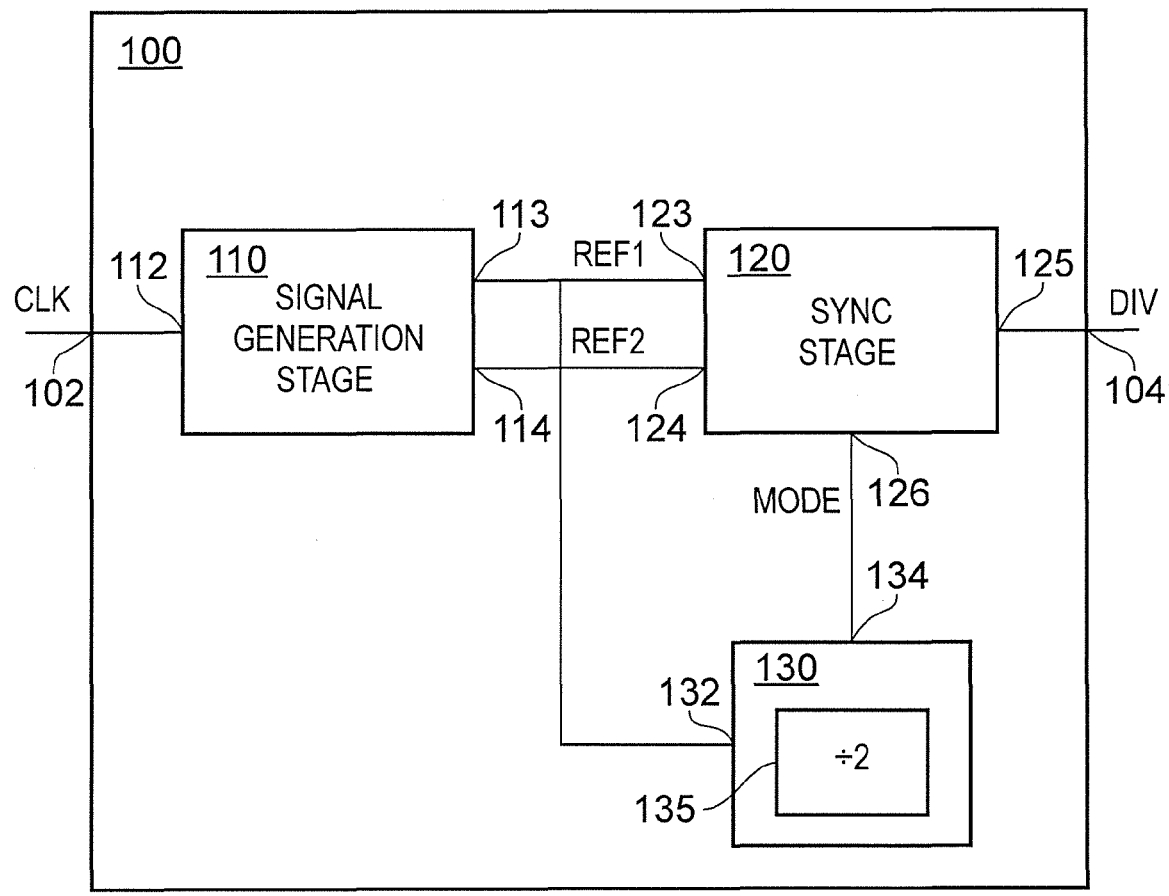
FIG. 3 is a schematic diagram of a frequency divider illustrating another way of providing the selection signal, in particular for division by N.5 where N is an integer greater than unity.

An alternative arrangement of the mode control stage 130 is illustrated in FIG. 3. Referring to FIG. 3, there is illustrated a frequency divider 100 having the elements illustrated in, and described with reference to, FIGS. 1 and 2, but instead of the first input 132 of the mode control stage 130 being coupled to the signal output 125 of the synchronisation stage 120 for receiving the output signal DIV, the first input 132 of the mode control stage 130 is coupled to the first reference output 113 for receiving the first reference signal REF1. The selection signal MODE is indicative of the completion of each cycle of the first reference signal REF1. This arrangement of the mode control stage 130 is suitable, in particular, when the output frequency is divided from the clock frequency by a division ratio of N or N.5, where N is an integer greater than unity. The mode control stage 130 can comprise, for example, a divide-by-two stage 135 for dividing the first reference signal REF1 by two. In this way, the selection signal MODE has a frequency equal to half the frequency of the first reference signal REF1, with transitions in the selection signal MODE occurring once per cycle of the first reference signal REF1, which corresponds to once per cycle of the output signal DIV.

Figure 4:
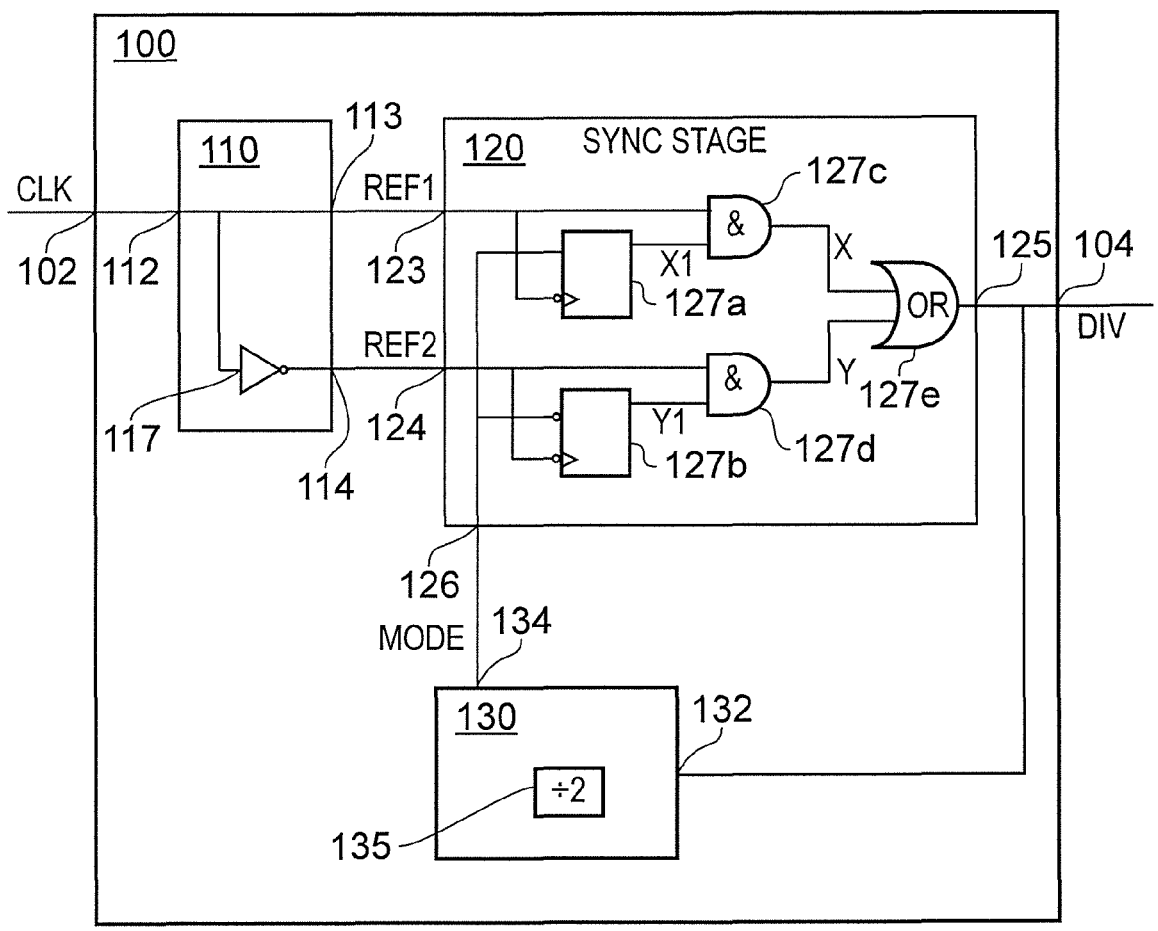
FIG. 4 is a schematic diagram of a frequency divider for division by 1.5 and showing embodiments of the signal generation stage and synchronisation stage for single ended signals.

Referring to FIG. 4, an embodiment of the frequency divider 100 for division by 1.5 comprises the elements described with reference to FIGS. 1 and 2. The first input 112 of the signal generation stage 110 is coupled to the first reference output 113 for delivering the clock signal CLK as the first reference signal REF1. There is a first inverter 117 coupled between first input 112 of the signal generation stage 110 and the second reference output 114 for delivering the inverse clock signal −CLK as the second reference signal REF2. Alternatively, if the clock CLK is available in a differential form, the inverse clock signal −CLK is available for use directly as the second reference signal REF2, and the first inverter 117 can be dispensed with. The synchronisation stage 120 comprises a first flip flop 127a having a first non-inverting input coupled to the mode control input 126, and a second inverting input coupled to the first reference input 123. An output of the first flip flop 127a is coupled to a first input of a first AND gate 127c, and a second input of the first AND gate 127c is coupled to the first reference input 123. An output of the first AND gate 127c is coupled to a first input of an OR gate 127e. The synchronisation stage 120 also comprises a second flip flop 127b having a first inverting input coupled to the mode control input 126, and a second inverting input coupled to the second reference input 124. An output of the second flip flop 127b is coupled to a first input of a second AND gate 127d, and a second input of the second AND gate 127d is coupled to the second reference input 124. An output of the second AND gate 127d is coupled to a second input of the OR gate 127e. An output of the OR gate is coupled to the signal output 125 of the synchronisation stage 120 for delivering the output signal DIV to the output 104 of the frequency divider 100. The mode control stage 130 comprises the divide-by-two stage 135 for dividing the output signal DIV by two.

In a variation of the synchronisation stage 120 illustrated in FIG. 4, other arrangements of logic gates may be used to deliver the same output signal DIV.

Figure 5:
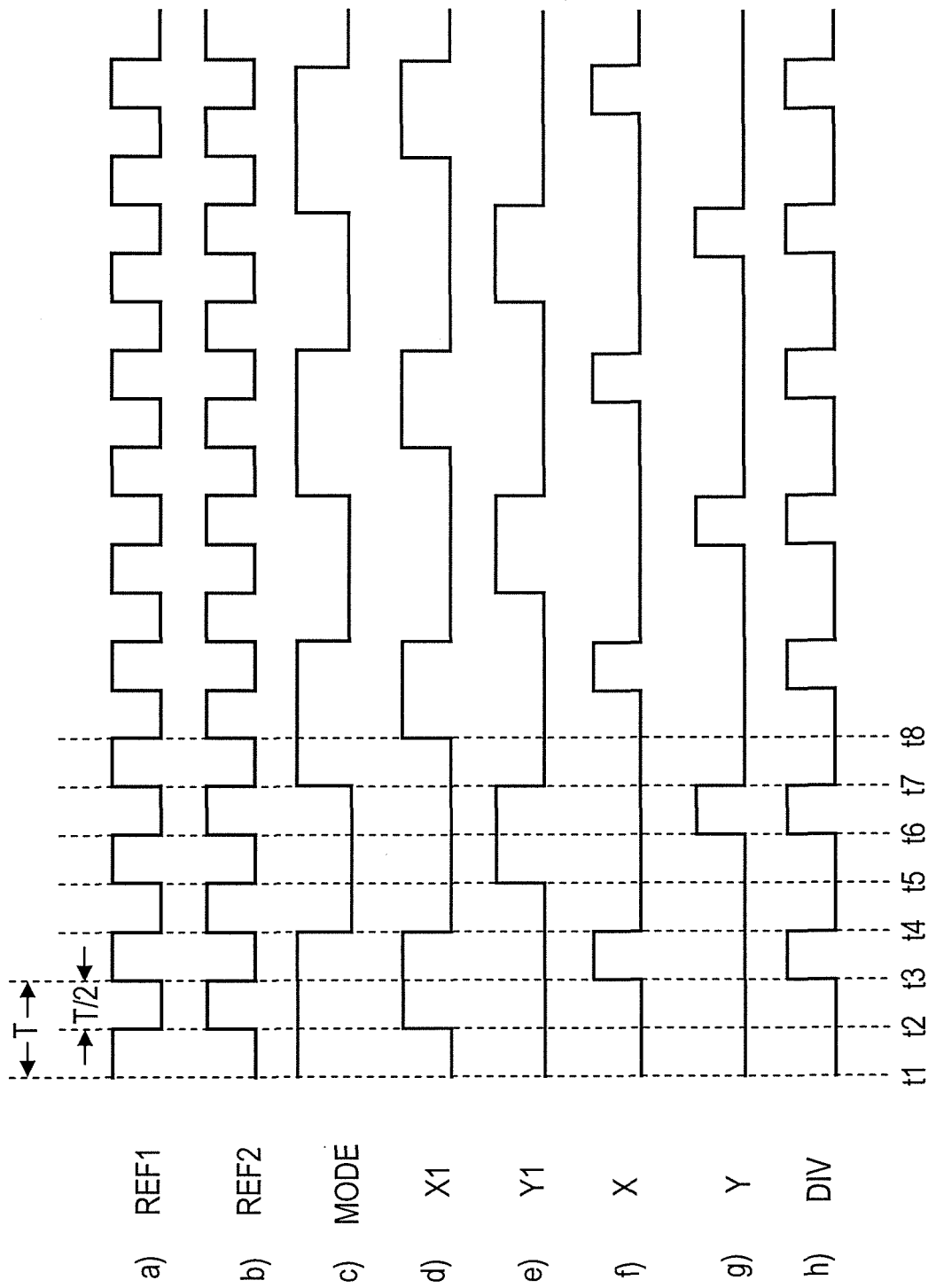
FIG. 5 illustrates waveforms of signals in the frequency divider of FIG. 4.

Referring to FIG. 5, there are illustrated waveforms of signals in the frequency divider 100 of FIG. 4. Waveform a) is the first reference signal REF1, corresponding to the clock signal CLK, and is a square wave having a period denoted T and a duty cycle of 50%. Waveform b) is the second reference signal REF2 which corresponds to an inversion of the first reference signal REF1.

At time t1, the selection signal MODE, shown at waveform c) is initially at a high level. Also at time t1, the signal at the output of the first flip flop 127a, referenced as X1, and shown as waveform d), is at a low level. Likewise, the signal at the output of the second flip flop 127b, referenced as Y1, and shown as waveform e), is at a low level. Consequently, the signal, referenced X and shown as waveform f), at output of the first AND gate 127c, and the signal, referenced Y and shown as waveform g), at the output of the second AND gate 127d, are at a low level, and therefore so is the output signal DIV shown as waveform h).

At time t2, the first reference signal REF1 has a falling edge, changing from a high level to a low level. The falling edge of the first reference signal REF1 which is applied to the second inverting input of the first flip flop 127a, which is a clocking input, causes the signal X1 to change to a high level as the high level of the selection signal MODE is clocked through the first flip flop 127a. As a result, the first reference signal REF1 is enabled to pass through the first AND gate 127c as the signal X, and therefore the signal X is maintained at a low level.

At time t3, the first reference signal REF1 changes to a high level. Consequently, the signal X at the output of the first AND gate 127c changes to a high level, and therefore the output signal DIV changes to a high level. In this way, the first reference signal REF1 is passed through the first AND gate 127c, and through the OR gate 127e to the signal output 125 of the synchronisation stage 120 as the output signal DIV, shown in waveform h), and simultaneously the second reference signal REF2 is inhibited from passing through the second AND gate 127d.

At time t4, the falling edge of the first reference signal REF1 passes through the first AND gate 127c to the signal X, and therefore to the output signal DIV. The divide-by-two stage 135 delivers a signal transition in the selection signal MODE for each alternate transition in the output signal DIV, in particular at each falling edge of the output signal DIV, so at the time t4, a falling transition of the output signal DIV causes the selection signal MODE to change to a low level.

The change of the selection signal MODE to the low level at time t4 results in the first reference signal REF1 being inhibited from being passed through the first AND gate 127c. However, during the period from time t4 to time t5 the signal X, and therefore the output signal DIV, maintain the low level of the first reference signal REF1 established at time t4.

At time t5 the falling edge of the second reference signal REF2 which is applied to the second inverting input of the second flip flop 127b, which is a clocking input, causes the signal Y1 to change to a high level as the selection signal MODE is clocked through, and inverted by, the second flip flop 127d. This enables the second reference signal REF2 to be passed through the second AND gate 127d, and through the OR gate 127e to the signal output 125 of the synchronisation stage 120 as the output signal DIV.

At time t6, the second reference signal REF2 changes to a high level. Consequently, the signal Y at the output of the second AND gate 127d changes to a high level, and therefore the output signal DIV changes to a high level. In this way, the second reference signal REF2 is passed through the second AND gate 127d, and through the OR gate 127e to the signal output 125 of the synchronisation stage 120 as the output signal DIV, and simultaneously the first reference signal REF1 is inhibited from passing through the first AND gate 127c.

At time t7, the falling edge of the second reference signal REF2 passes through the second AND gate 127d to the signal Y, and therefore to the output signal DIV. The divide-by-two stage 135 delivers a signal transition in the selection signal MODE for each alternate transition in the output signal DIV, in particular at each falling edge of the output signal DIV, so at the time t7, a falling transition of the output signal DIV causes the selection signal MODE to change to a high level. The change of the selection signal MODE to the high level at time t7 results in the second reference signal REF2 being inhibited from being passed through the second AND gate 127d. However, during the period from time t7 to time t8 the signal Y, and therefore the output signal DIV, maintain the low level of the second reference signal REF2 established at time t7.

At time t8, the falling edge of the first reference signal REF1 which is applied to the second inverting input of the first flip flop 127a, which is a clocking input, causes the signal X1 to change to a high level as the selection signal MODE is clocked through, and inverted by, the first flip flop 127a. This enables the first reference signal REF1 to be passed through the first AND gate 127c, and through the OR gate 127e to the signal output 125 of the synchronisation stage 120 as the output signal DIV, as at time t2, and the cycle of events from time t2 repeats.

In this way, the output signal DIV comprises portions of the first and second reference signals REF1, REF2, and has pulses of duration T/2 spaced apart by intervals of duration T. More specifically, the output signal DIV comprises, alternately, portions of the first and second reference signals REF1, REF2, spaced apart by a half a period of the clock signal CLK during which time the ultimate level of the previous one of the portions is maintained. Therefore, the output signal DIV has a period corresponding to 3T/2, and has pulses of duration T/2 spaced apart by intervals of duration T, corresponding to the clock frequency divided by 1.5. The signals X and Y present at the outputs of, respectively, the first and second AND gates 127c, 127d, comprise the constituent pulses that together form the output signal DIV.

Figure 6:
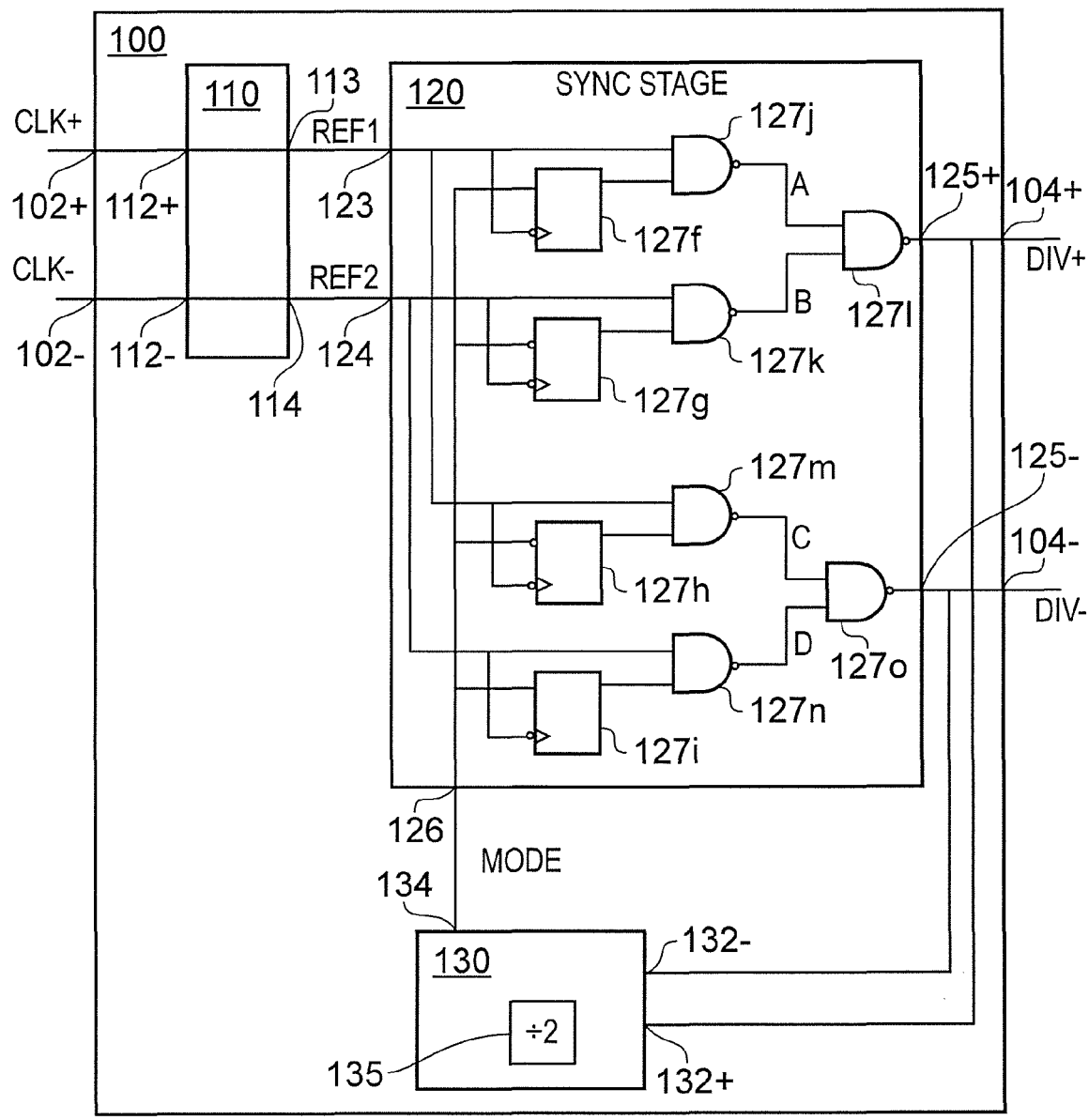
FIG. 6 is a schematic diagram of a frequency divider for division by 1.5 and showing embodiments of the signal generation stage and synchronisation stage for differential signals.

Referring to FIG. 6, an embodiment of the frequency divider 100 for division by 1.5 and using differential signals comprises the elements described with reference to FIGS. 1 and 2. The clock signal CLK is in a differential format and first and second differential components of the clock signal CLK are referenced as CLK+ and CLK−. Correspondingly, the input 102 of the frequency divider 100 has first input components 102+, 102− for receiving the respective first and second differential components CLK+, CLK− of the clock signal CLK. Likewise, the first input 112 of the signal generation stage 110 has first input components 112+, 112− for receiving the respective first and second differential components CLK+, CLK− of the clock signal CLK. The first and second differential components CLK+, CLK− of the clock signal CLK are delivered to, respectively, the first and second reference outputs 113, 114 of the signal generation stage 110 for use as, respectively the first and second reference signal REF1, REF2.

The synchronisation stage 120 comprises a first flip flop 127$f$ having a first non-inverting input coupled to the mode control input 126, and a second inverting input coupled to the first reference input 123. An output of the first flip flop 127$f$ is coupled to a first input of a first NAND gate 127$j$, and a second input of the first NAND gate 127$j$ is coupled to the first reference input 123. An output of the first NAND gate 127$j$ is coupled to a first input of a third NAND gate 127$l$. The synchronisation stage 120 also comprises a second flip flop 127$g$ having a first inverting input coupled to the mode control input 126, and a second inverting input coupled to the second reference input 124. An output of the second flip flop 127$g$ is coupled to a first input of a second NAND gate 127$k$, and a second input of the second NAND gate 127$k$ is coupled to the second reference input 124. An output of the second NAND gate 127$k$ is coupled to a second input of the third NAND gate 127$l$. Furthermore, the synchronisation stage 120 comprises a third flip flop 127$h$ having a first inverting input coupled to the mode control input 126, and a second inverting input coupled to the first reference input 123. An output of the third flip flop 127$h$ is coupled to a first input of a fourth NAND gate 127$m$, and a second input of the fourth NAND gate 127$m$ is coupled to the first reference input 123. An output of the fourth NAND gate 127$m$ is coupled to a first input of a sixth NAND gate 127$o$. The synchronisation stage 120 also comprises a fourth flip flop 127$i$ having a first non-inverting input coupled to the mode control input 126, and a second inverting input coupled to the second reference input 124. An output of the fourth flip flop 127$i$ is coupled to a first input of a fifth NAND gate 127$n$, and a second input of the fifth NAND gate 127$n$ is coupled to the second reference input 124. An output of the fifth NAND gate 127$n$ is coupled to a second input of the sixth NAND gate 127$o$.

Outputs of the third NAND gate 127$l$ and sixth NAND gate 127$o$ are coupled to respective signal output components 125+, 125− of the signal output 125 of the synchronisation stage 120 for delivering respective differential output signal components DIV+, DIV− of the output signal DIV to respective output components 104+, 104− of the output 104 of the frequency divider 100. The mode control stage 130, comprising the divide-by-two stage 135 arranged for employing signals in a differential format, has differential input components 132+, 132− of the first input 132 of the mode control stage 130 coupled to the differential output components 104+, 104− of the output 104 of the frequency divider 100 for dividing the output signal DIV by two.

In a variation of the synchronisation stage 120 illustrated in FIG. 6, other arrangements of logic gates may be used to deliver the same differential output signal components DIV+, DIV−.

Figure 7:
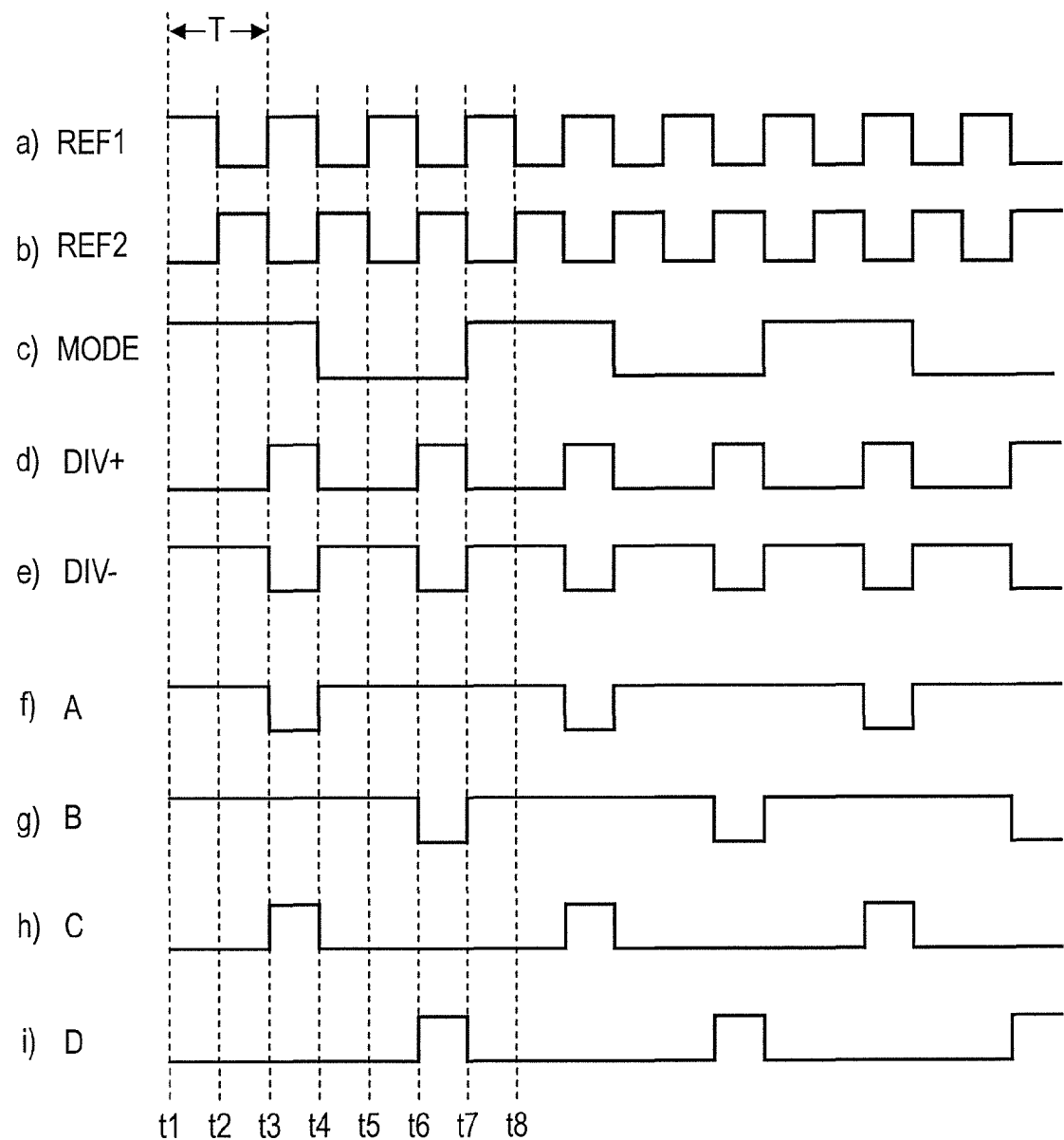
FIG. 7 illustrates waveforms of signals in the frequency divider of FIG. 6.

Referring to FIG. 7, there are illustrated waveforms of signals in the frequency divider 100 of FIG. 6. Waveform a) is the first reference signal REF1, corresponding to the first differential component of the clock signal CLK+, and is a square wave having a period denoted T and a duty cycle of 50%. Waveform b) is the second reference signal REF2 and corresponds to an inversion of the first reference signal REF1, and also corresponds to the second differential component of the clock signal CLK−. Waveform c) is the selection signal MODE which is initially at a high level.

At time t1, the selection signal MODE is initially at a high level. Also at time t1, the signal at the output of the first flip flop 127$f$ is at a low level, and the first reference signal REF1 is at a high level. Therefore, the signal denoted A at the output of the first NAND gate 127$j$ is at a high level. Likewise, at time t1, the signal at the output of the second flip flop 127$g$ is at a low level, and the second reference signal REF2 is at a low level. Therefore, the signal denoted B at the output of the second NAND gate 127$k$ is at a high level. Consequently, the signal at the output of the third NAND gate 127$l$, which delivers the first differential component of the output signal DIV+, is at a low level. In a corresponding manner, at time t1, the signals denoted C and D at the outputs of, respectively, the fourth and fifth NAND gates 127$m$, 127$n$ are at a low level, and the signal at the output of the sixth NAND gate 127$o$ which delivers the second differential component of the output signal DIV−, is at a high level.

At time t2, the first reference signal REF1 has a falling edge, changing from a high level to a low level. The falling edge of the first reference signal REF1 which is applied to the second inverting input of the first flip flop 127$f$, which is a clocking input, causes the high level selection signal MODE to be clocked through the first flip flop 127$f$, As a result, the first reference signal REF1 is enabled to pass through, and be inverted by, the first NAND gate 127$j$ as the signal A, and therefore the signal A is maintained at the high level. Also at time t2, the second reference signal REF2 has a rise edge, changing from a low level to a high level, but no change results to the signal B, which remains at a high level and therefore enables the signal A to pass through, and be inverted by, the third NAND gate 127$l$ as the first differential component of the output signal DIV+.

At time t3, the first reference signal REF1 changes to a high level. Consequently, the signal A at the output of the first NAND gate 127$j$ changes to a low level. Also at time t3, the falling edge of the second reference signal REF2, which is applied to the second inverting input of the second flip flop 127$g$, which is a clocking input, causes the inverse of the high level selection signal MODE to be clocked through the first flip flop 127$f$, but, by the operation of the second NAND gate 127$k$, the signal B remains at a high level. Consequently, the first differential component of the output signal DIV+ changes to a high level. In this way, the first reference signal REF1 is passed through the first NAND gate 127$j$, and through the third NAND gate 127$l$ as the first differential component of the output signal DIV+, shown at waveform d), and simultaneously the second reference signal REF2 is inhibited from passing through the second NAND gate 127$k$.

At time t4, the falling edge of the first reference signal REF1 causes the signal A at the output of the first NAND gate 127$j$ to change from a low to a high level, and consequently, by operation of the second NAND gate 127$k$, the first differential component of the output signal DIV+ changes to a low level. The divide-by-two stage 135 delivers a signal transition in the selection signal MODE for each alternate transition in the first and second differential components of the output signal DIV+, DIV−, in particular at each falling edge of the first differential component of the output signal DIV+ and each rising edge of the second differential component of the output signal DIV−, so at the time t4, the transitions in the first and second differential components of the output signal DIV+, DIV− cause the selection signal MODE to change to a low level.

The change of the selection signal MODE to the low level at time t4 results in changes in the first reference signal REF1 being inhibited from being passed through the first NAND gate 127*j* to the first differential component of the output signal DIV+. However, during the period from time t4 to time t5 the signal A maintains the high level established at time t4, and therefore the first differential component of the output signal DIV+ maintains the low level of the first reference signal REF1 established at time t4.

At time t5 the falling edge of the second reference signal REF2 which is applied to the second inverting input of the second flip flop 127*g*, which is a clocking input, causes the selection signal MODE to be clocked through, and inverted by, the second flip flop 127*g*. This enables transitions in the second reference signal REF2 to be passed through the second NAND gate 127*k*, and through the third NAND gate 127*l* to the signal output as the first differential component of the output signal DIV+.

At time t6, the second reference signal REF2 changes to a high level. Consequently, the signal B at the output of the second NAND gate 127*k* changes to a low level, and therefore the first differential component of the output signal DIV+ changes to a high level. In this way, the transition in the second reference signal REF2 is passed through the second NAND gate 127*k*, and through the second NAND gate 127*l* to the signal as the second differential component of the output signal DIV−, and simultaneously any transition in the first reference signal REF1 is inhibited from passing through the first NAND gate 127*j*.

At time t7, the falling edge of the second reference signal REF2 passes through the second NAND gate 127*k* to the signal B, and therefore to the first differential component of the output signal DIV+. The divide-by-two stage 135, which delivers a signal transition in the selection signal MODE for each alternate transition in the first and second differential components of the output signal DIV+, DIV−, in particular at each falling edge of the first differential component of the output signal DIV+ and each rising edge of the second differential component of the output signal DIV−, at the time t7 causes the selection signal MODE to change to a high level. The change of the selection signal MODE to the high level at time t7 results in transitions in the second reference signal REF2 being inhibited from passing through the second NAND gate 127*g*. However, during the period of time from time t7 to time t8, the signals A and B, and therefore the first differential component of the output signal DIV+, maintain the values established at time t7.

At time t8, the falling edge of the first reference signal REF1 which is applied to the second inverting input of the first flip flop 127*f*, which is a clocking input, causes the signal at the output of the first flip flop 127*f* to change to a high level as the selection signal MODE is clocked through first flip flop 127*f*. This enables transitions in the first reference signal REF1 to be pass through the first NAND gate 127*j* and the second NAND gate 127*l* to the first differential component of the output signal DIV+, and the cycle of events from time t2 repeats.

The third and fourth flip flops 127*h*, 127*i*, and the fourth, fifth and sixth NABD gates 127*m*, 127*n*, 127*o*, operate in a corresponding manner to the first and second flip flops 127*f*, 127*g* and the first, second and third NAND gates 127*j*, 127*k*, 127*l*, but with the third flip flop having the first inverting input being clocked by the first reference signal REF1, and the fourth flip flop having the first non-inverting input being clocked by the second reference signal REF2, and generate the second differential component of the output signal DIV−.

By operation of the synchronisation stage 120 as described with reference to FIG. 6, the first and second differential output signal components DIV+, DIV− of the output signal DIV both comprise portions of the first and second reference signals REF1, REF2, and have pulses of duration T/2 spaced apart by intervals of duration T. More specifically, the first and second differential components of the output signal DIV+, DIV− each comprise, alternately, portions of the first and second reference signals REF1, REF2, spaced apart by a half period of the clock signal CLK during which time the ultimate level of the previous one of the portions is maintained. Therefore, the output signal DIV has a period 3T/2 corresponding to division of the clock frequency by 1.5 and a duty cycle of 33%.

Figure 8:
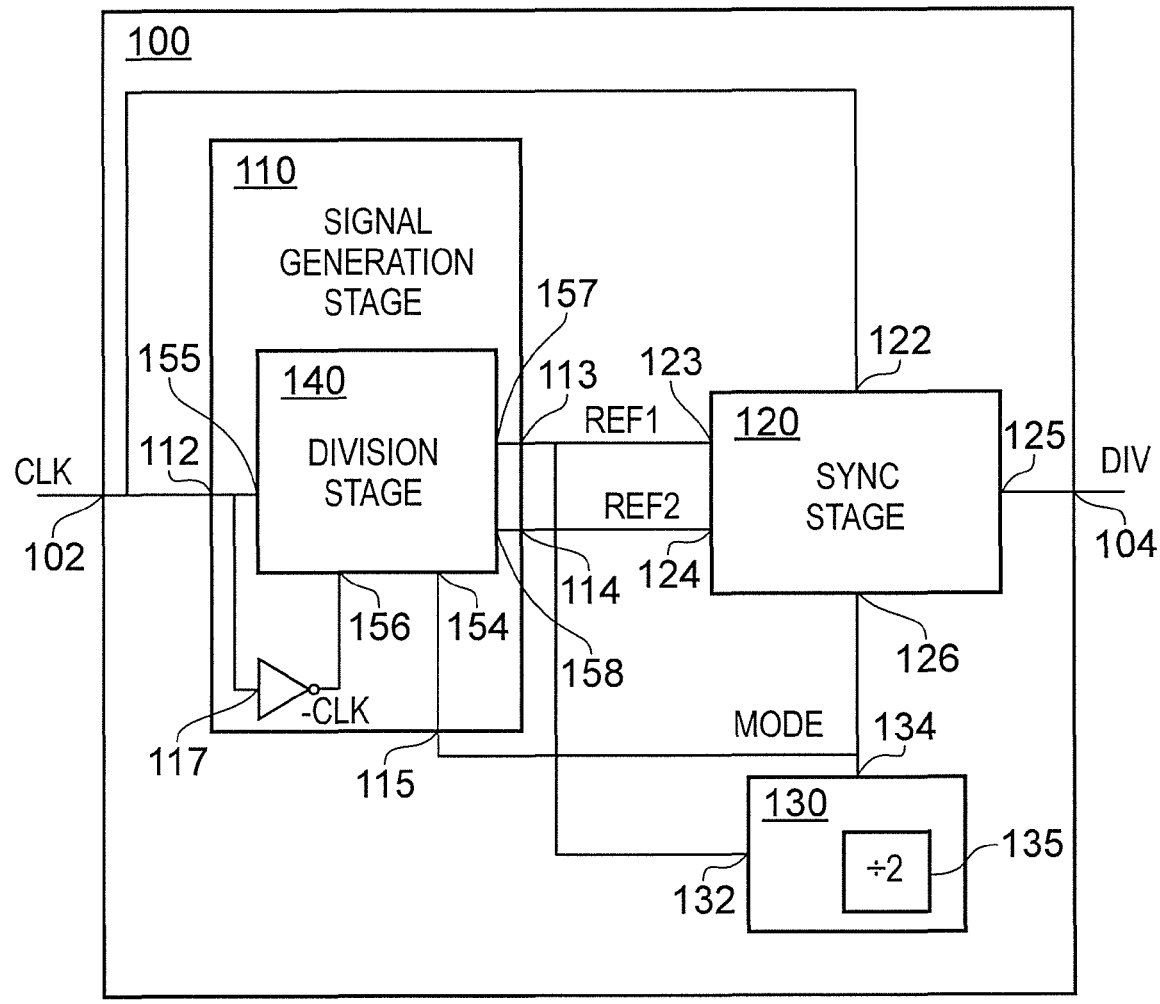
FIG. 8 is a schematic diagram of a frequency divider, in particular for division by N.5 where N is an integer greater than or equal to unity.

Referring to FIG. 8, an embodiment of the frequency divider 100 for division by a division ratio N.5, where N in an integer greater than unity, comprises the elements described with reference to FIGS. 1 and 3. The first input 112 of the signal generator 112 is coupled to a first input 155 of a division stage 140 and to a clock input 122 of the synchronisation stage 120 for delivering the clock signal CLK to, respectively, the division stage 140 and the synchronisation stage 120. The signal generation stage 110 has a first inverter 117 coupled between the first input 112 of the signal generation stage 110 and a second input 156 of the division stage 140 for delivering an inversion of the clock signal CLK, referenced −CLK, to the division stage 140. Alternatively, if the clock CLK is available in a differential form, the inversion of the clock signal CLK is available for use directly and can be delivered to the second input 156 of the division stage 140. A second input 115 of the signal generation stage 110 is coupled to the first output 134 of the mode control stage 130 for receiving the selection signal MODE. A third input 154 of the division stage 140 is coupled to the second input 115 of the signal generation stage 110 for receiving the selection signal MODE. A first output 157 of the division stage 140 and a second output 158 of the division stage 140 are coupled to, respectively, the first and second reference outputs 113, 114 of the signal generation stage 110. In the embodiment illustrated in FIG. 8, the first reference signal REF1 is generated by the division stage 140 dividing the clock signal CLK by an integer division ratio, and by use of the inverted form of the clock signal CLK, referenced −CLK, the second reference signal REF2 corresponds to the first reference signal REF1 delayed by a half period of the first reference signal REF1.

The division stage 140 can provide division by an integer value which is odd or even and need not be a power of two. For division by N.5, where N is any integer greater than unity, the frequency divider 100 illustrated in FIG. 8 controls the division stage 140 to alternately increase and decrease the division ratio between two integer values which differ by unity, in particular N and N+1, that is, between consecutive odd and even integers, in response to the selection signal MODE as described below, such that the average division ratio is N.5.

Figure 9:
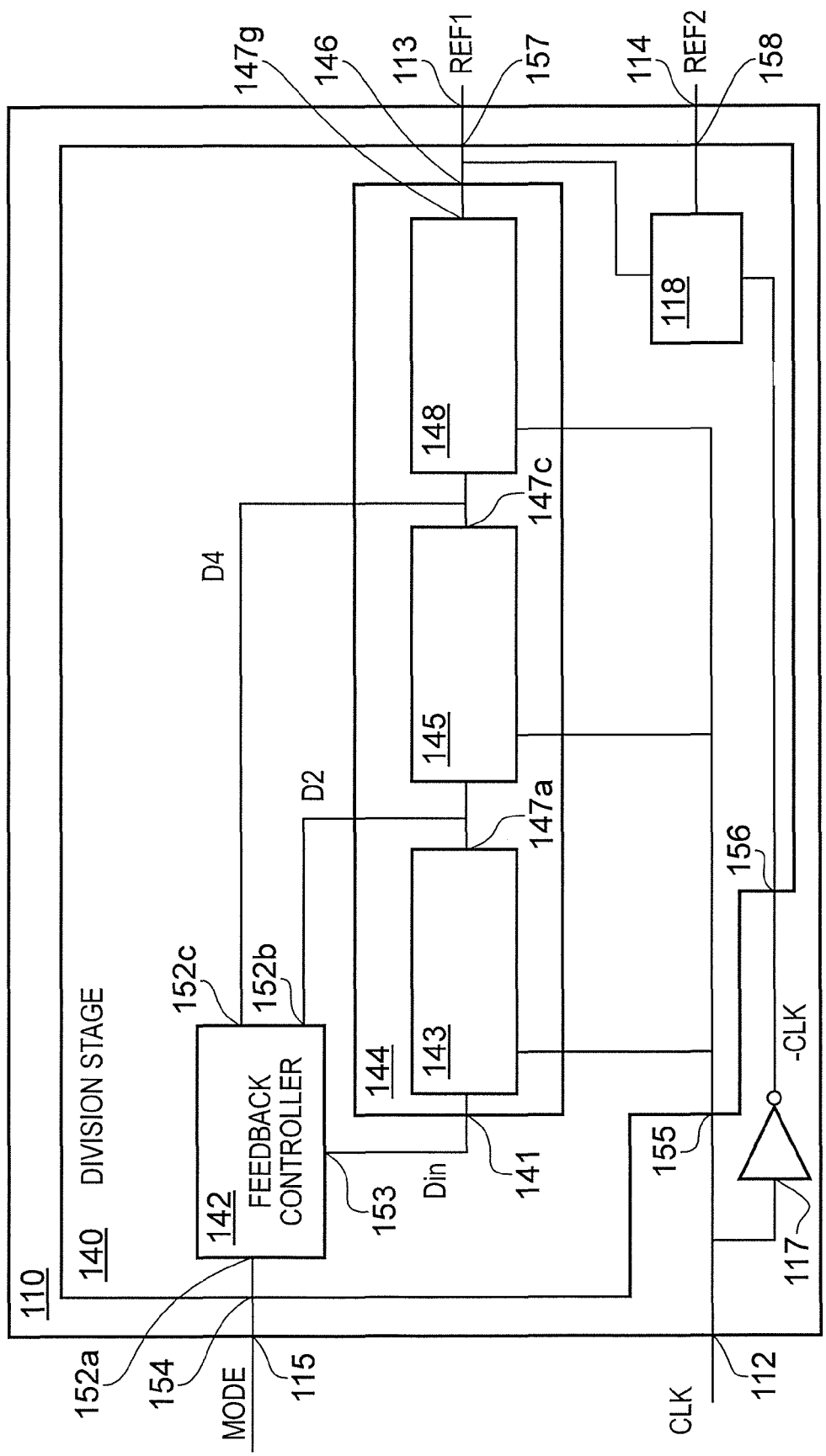
FIG. 9 is a schematic diagram of a division stage.

Referring to FIG. 9, an embodiment of the division stage 140 for use in the embodiment of the frequency divider 100 illustrated in FIG. 8 comprises a clocked delay line 144 and a feedback controller 142. The third input 154 of the division stage 140 is coupled to a first input 152*a* of the feedback controller 142. An input 141 of the clocked delay line 144 is coupled to an output 153 of the feedback controller 142 for receiving a delay line input signal Din from the feedback controller 142, and a first output 146 of the clocked delay line 144 is coupled to the first output 157 of the division stage 140 for delivering the first reference signal REF1 to the first reference output 113 of the signal generation stage 110. The first output 146 of the clocked delay line 144 is also coupled to the second output 158 of the division stage 140 by means of a delay means 118, for example a flip flop, or another circuit, clocked by the inverse clock signal –CLK, for delivering the second reference signal REF2 to the second reference output 114 of the signal generation stage 110. The delay means 118 is coupled to the second input 156 of the division stage 140 for receiving the inverse clock signal –CLK. The clocked delay line 144 has first, second and third delay stages 143, 145, 148 coupled in series between the input 141 of the clocked delay line 144 and the first output 146 of the clocked delay line 144. Each of the first, second and third delay stages 143, 145, 148 can comprise, for example, a flip flop. An input of the first delay stage 143 is coupled to the input 141 of the clocked delay line 144 and an output 147g of the third delay stage 148 is coupled to the first output 146 of the clocked delay line 144. The first, second and third delay stages 143, 145, 148 are coupled to the first input 155 of the division stage 140 for receiving the clock signal CLK by which they are clocked. Consequently, the delay line input signal Din is clocked through the clocked delay line 144, advancing through the successive first, second and third delay stages 143, 145, 148 by one of the delay stages 143, 145, 148 for each cycle, that is each period T, of the clock signal CLK. An output 147a of the first delay stage 143 is coupled to a second input 152b of the feedback controller 142 for delivering a first feedback signal D2, and an output 147c of the second delay stage 145 is coupled to a third input 152c of the feedback controller 142 for delivering a second feedback signal D4. The delay line input signal Din is periodic, and therefore so are also the first and second feedback signals D2, D4 and the first and second reference signals REF1, REF2.

Although in the embodiment of the division stage illustrated in FIG. 9 the first and second reference signals REF1, REF2 are both derived from the first output 146 of the clocked delay line, more generally, the first and second reference signals REF1, REF2 can be derived from outputs of any of the first, second and third delay stages 143, 145, 148 coupled in series between the input 141 of the clocked delay line 144 and the first output 146 of the clocked delay line 144, provided the required delay relationship between the first and second reference signals REF1, REF2 is provided.

Figure 10:
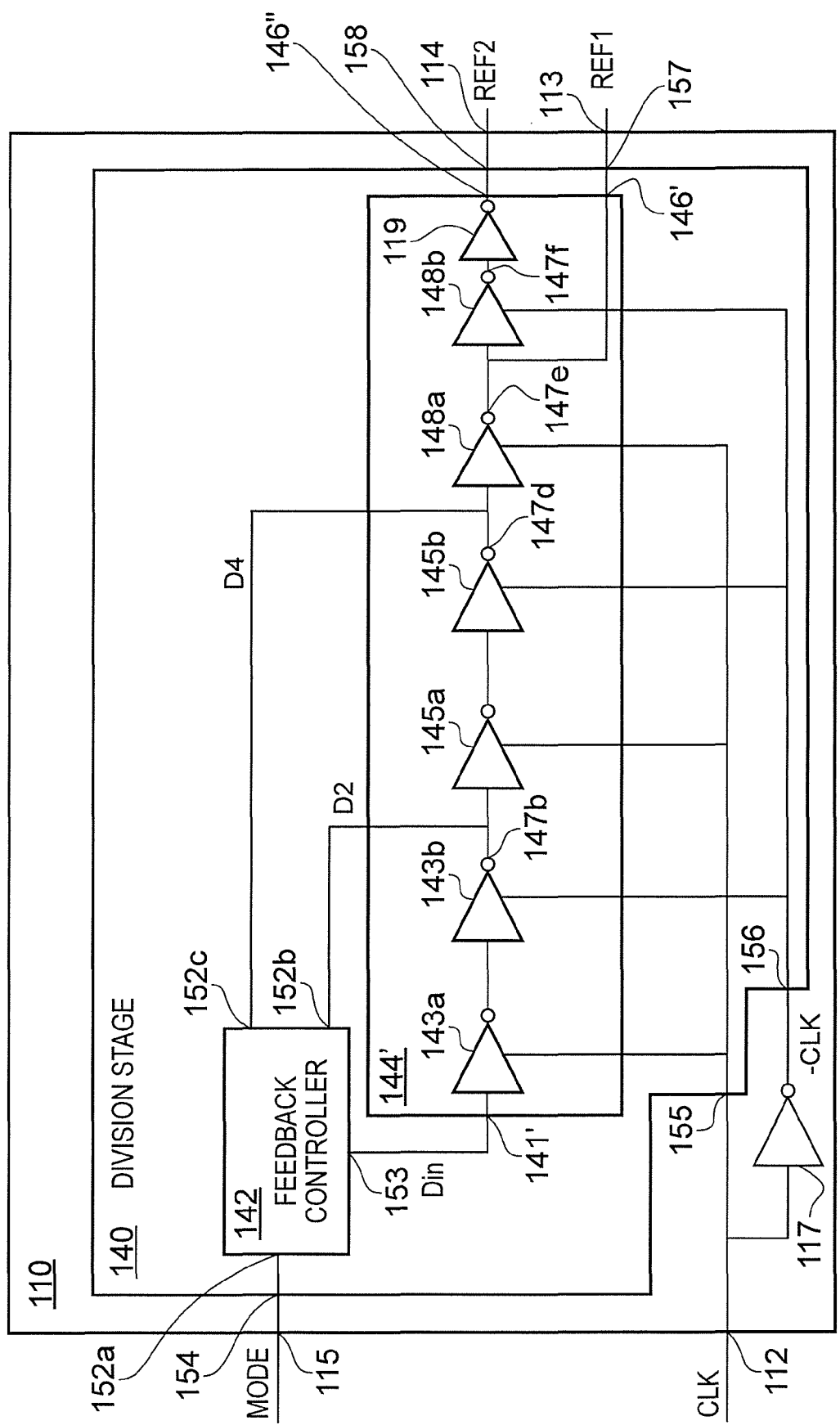
FIG. 10 is a schematic diagram of another embodiment of a division stage.

Referring to FIG. 10, another embodiment of the division stage 140 for use in the embodiment of the frequency divider 100 illustrated in FIG. 8 comprises a clocked delay line 144' and the feedback controller 142 described above with reference to FIG. 9. The third input 154 of the division stage is coupled to a first input 152a of the feedback controller 142. An input 141' of the clocked delay line 144' is coupled to the output 153 of the feedback controller 142 for receiving the delay line input signal Din from the feedback controller 142, and a first output 146' of the clocked delay line 144' is coupled to the first output 157 of the division stage 140 for delivering the first reference signal REF1 to the first reference output 113 of the signal generation stage 110. A second output 146" of the clocked delay line 144' is coupled to the second output 158 of the division stage 140 for delivering the second reference signal REF2 to the second reference output 114 of the signal generation stage 100. The clocked delay line 144' has first, second, third, fourth, fifth and sixth delay stages 143a, 143b, 145a, 145b, 148a, 148b coupled in series between the input 141' of the clocked delay line 144' and the second output 146" of the clocked delay line 144'. Each of the first, second, third, fourth, fifth and sixth delay stages 143a, 143b, 145a, 145b, 148a, 148b provide signal inversion and may comprise, for example, a tri-state inverter circuit.

Figure 27:
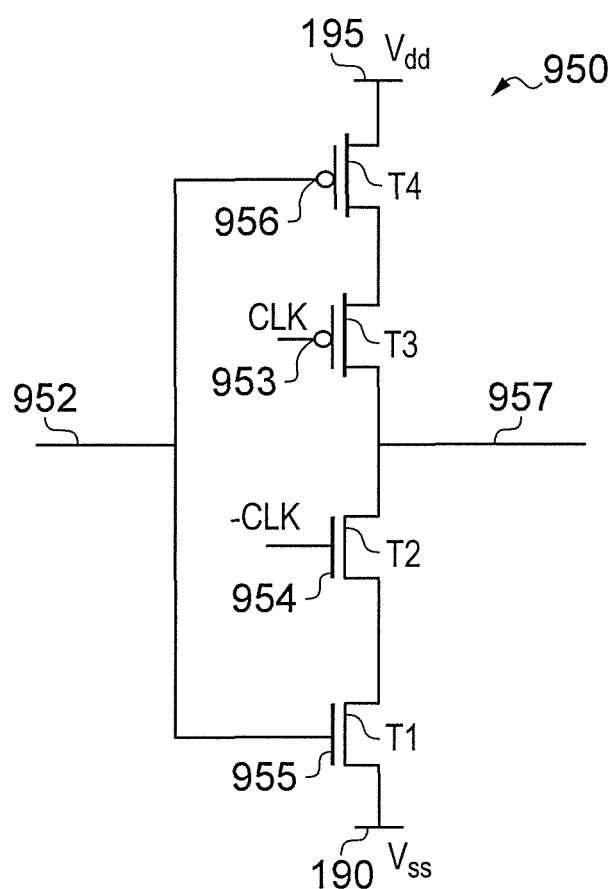
FIG. 27 is a circuit diagram of a tri-state inverter.

Referring to FIG. 27, a tri-state inverter circuit 950 comprises a first NMOS transistor T1 having a drain coupled to a first voltage rail 190 having a relatively low voltage $V_{ss}$, which may be ground, and a source coupled to a drain of a second NMOS transistor T2. A source of the second NMOS transistor T2 is coupled to an output 957 of the tri-state inverter 950 and to a drain of a first PMOS transistor T3. A source of the first PMOS transistor T3 is coupled to a drain of a second PMOS transistor T4. A source of the second PMOS transistor T4 is coupled to a second voltage supply rail 195 having a relatively high voltage $V_{dd}$. A signal to be inverted is applied to an input 952 of the tri-state inverter 950 which is coupled to a gate 955 of the first NMOS transistor T1 and a gate 956 of the second PMOS transistor T4. The clock signal CLK is applied to a gate 953 of the first PMOS transistor T3, and the inverse of the clock signal –CLK is applied to a gate 954 of the second NMOS transistor T2. In operation, when the clock signal CLK has a high level, the inverted signal is delivered at the output 957 of the tri-state inverter 950, and when the clock signal has a low level, the output 957 of the tri-state inverter 950 is isolated from the input 952 of the tri-state inverter 950 by the second NMOS transistor T2 and the first PMOS transistor T3, and therefore has a high impedance state.

Reverting to FIG. 10, an input of the first delay stage 143a is coupled to the input 141' of the clocked delay line 144' and an output 147e of the fifth delay stage 148a is coupled to the first output 146' of the clocked delay line 144' for delivering the first reference signal REF1. The delay stages 143a, 145a, 148a occupying the odd numbered positions, that is the first, third and fifth delay stages 143a, 145a, 148a, in the clocked delay line 144', are coupled to the first input 155 of the division stage 140 to be clocked by the clock signal CLK. The delay stages 143b, 145b, 148b occupying even numbered positions, that is the second, fourth and sixth delay stages 143b, 145b, 148b in the clocked delay line 144' are coupled to the second input 156 of the division stage 140 to be clocked by the inverted form of the clock signal –CLK. Consequently, the delay line input signal Din is clocked through the clocked delay line 144', advancing through the successive delay stages 143a, 143b, 145a, 145b, 148a, 148b by one of the delay stages 143a, 143b, 145a, 145b, 148a, 148b for each half cycle, that is each half period T/2, of the clock signal CLK. An output 147b of the second delay stage 143b is coupled to the second input 152b of the feedback controller 142 for delivering the first feedback signal D2, and an output 147d of the fourth delay stage 145b is coupled to the third input 152c of the feedback controller 142 for delivering the second feedback signal D4. An output of the final delay stage of the clocked delay line 144', that is the sixth delay stage 148b is coupled by means of a second inverter 119 to the second output 141" of the clocked delay line 144' for delivering the second reference signal REF2. In this way, the first and second reference signals REF1, REF2 are derived from signals at outputs 147e, 147f of, respectively, the fifth and sixth delay stages 148a, 148b, that is at the outputs of former and latter delay stages of a pair of consecutive ones of the delay stages 143a, 143b, 145a, 145b, 148a, 148b. If differential circuits are employed, the required second reference signal REF2 may be available directly at the output of the sixth delay stage 148b, in which case the second inverter 119 may be omitted. The use of a differential circuit for producing inverse signals is preferable to the use of an inverter as a differential circuit can provide better balance between a signal and its inverse, can provide faster operation, and can provide a lower noise performance by avoiding any delay introduced by an inverter.

Although in the embodiment of the division stage illustrated in FIG. 10 the first and second reference signals REF1, REF2 are both derived from signals at outputs of, respectively, the fifth and sixth delay stages 148a, 148b, more generally, the first and second reference signals REF1, REF2 can be derived from outputs of any of the delay stages 143a, 143b, 145a, 145b, 148a, 148b of the clocked delay line 144', provided the required delay relationship between the first and second reference signals REF1, REF2 is provided.

The division stage 140, in the embodiments of both FIGS. 9 and 10, employs the first and second feedback signals D2, D4 to determine the delay line input signal Din, and consequently determine the division ratio of the division stage 140. For example, setting the delay line input signal Din equal to the first feedback signal D2 provides integer division with a division ratio of two. Setting the delay line input signal Din equal to the second feedback signal D4 provides integer division with a division ratio of four. Combining the first and second feedback signals D1, D2, as described below, can provide division ratios which are not a power of two, such as three or five. For providing other integer division ratios, the clocked delay line 144 may comprise a smaller or greater number of delay stages to provide feedback signals needed for the required division ratios.

The division stage 140 employs the selection signal MODE, in conjunction with the first and second feedback signals D1, D2, to provide division by a non-integer division ratio N.5 where N is an integer greater than unity. In this case, the division stage 140 is arranged to alternately increase and decrease the division ratio between two integer values which differ by unity, in particular N and N+1, that is, between consecutive odd and even integers, in response to the selection signal MODE, such that the average division ratio is N.5. The feedback controller 142 can alternately increase and decrease the integer division ratio by unity in response to the selection signal MODE by providing the delay line input signal Din to the input of the clocked delay line 141 dependent alternately on outputs of different ones of the delay stages 143, 145, 148, 143a, 143b, 145a, 145b, 148a, 148b.

Figure 11:
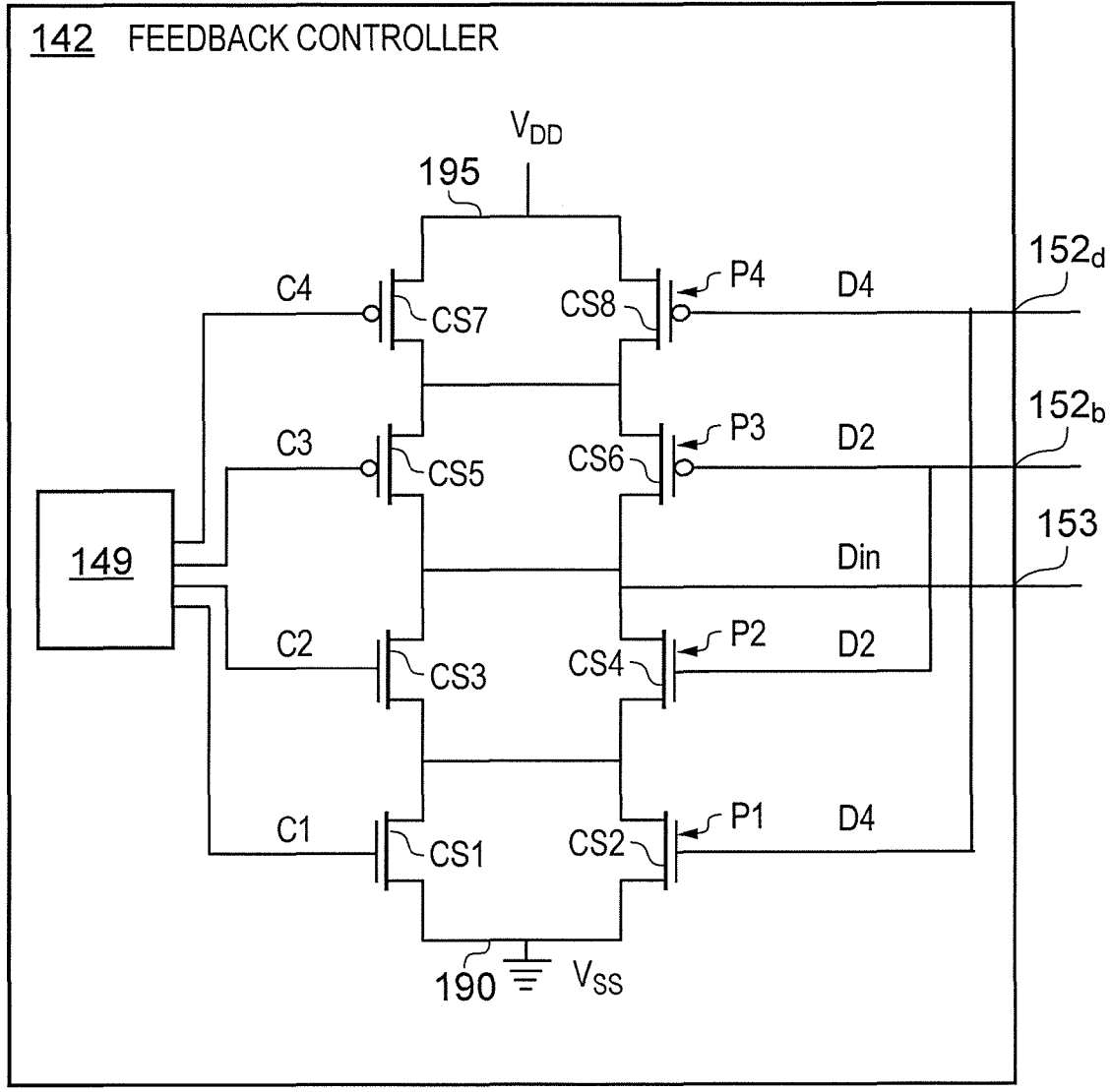
FIG. 11 is a schematic diagram of a feedback controller.

FIG. 11 illustrates an embodiment of the feedback controller 142 of the division stage 140 illustrated in FIGS. 9 and 10. Referring to FIG. 11, the feedback controller 142 comprises a first pair of switches P1 coupled in parallel, a second pair of switches P2 coupled in parallel, a third pair of switches P3 coupled in parallel, and a fourth pair of switches P4 coupled in parallel. The first and second pairs of switches P1, P2 are coupled in a series arrangement between the first voltage rail 190 at a relatively low voltage level $V_{ss}$, which may be ground, and the output 153 of the feedback controller 142. The third and fourth pairs of switches P3, P4 are coupled in a series arrangement between the second voltage rail 195 at a relatively high voltage level $V_{dd}$ and the output 153 of the feedback controller 142. The first pair of switches P1 comprises a first controller switch CS1 and a second controller switch CS2. The second pair of switches P2 comprises a third controller switch CS3 and a fourth controller switch CS4. The third pair of switches P3 comprises a fifth controller switch CS5 and a sixth controller switch CS6. The fourth pair of switches P4 comprises a seventh controller switch CS7 and an eighth controller switch CS8. Each of the first, second, third and fourth controller switches CS1, CS2, CS3, CS4 can comprise an NMOS transistor. Each of the fifth, sixth, seventh and eighth controller switches CS5, CS6, CS7, CS8 can comprise a PMOS transistor. The first, third, fifth and seventh controller switches CS1, CS3, CS5, CS7 are arranged to be switched in response to respective first, second, third and fourth switch control signals C1, C2, C3, C4 applied to respective switch control terminals, which in this particular embodiment are gates of the respective NMOS and PMOS transistors. The first, second, third and fourth switch control signals C1, C2, C3, C4 are controlled by the division stage 140 dependent on what integer division ratio the division stage 140 is required to provide. A decoder 149 maps, as explained below, the required division ratio into the switch control signals C1, C2, C3, C4 for switching the first, third, fifth and seventh controller switches CS1, CS3, CS5, CS7. The second and eighth controller switches CS2, CS8 are arranged to be switched responsive to the second feedback signal D4 by having respective switch control terminals, in this particular embodiment gates of the respective NMOS and PMOS transistors, coupled to the third input 152c of the feedback controller 142. The fourth and sixth controller switches CS4, CS6 are arranged to be switched responsive to the first feedback signal D2 by having respective switch control terminals, in this particular embodiment gates of the respective NMOS and PMOS transistors, coupled to the second input 152b of the feedback controller 142.

The first, third, fifth and seventh controller switches CS1, CS3, CS5, CS7 are open and closed dependent on the first, second, third and fourth switch control signals C1, C2, C35, C4 provided by the decoder 149 according to the required division ratio, and thereby determine whether, respectively, the second, fourth, sixth and eighth controller switches CS2, CS4, CS6, CS8 are short circuited, and consequently determine which of the first and second feedback signals D2, D4 affect the delay line input signal Din.

The operation of the feedback controller 142 of FIG. 11 will now be described with reference to FIG. 12 which illustrates the voltage waveforms of signals in the division stage 140 comprising the feedback controller 142 for the case of the division stage 140 performing division by three, and for the clocked delay line 144' described with reference to FIG. 10. For division by three, with a duty cycle of 67%, the decoder 149 sets the third switch control signal C3 to a high level, opening the fifth controller switch CS5, that is, placing the fifth controller switch CS5 in a non-conducting state and the first, second and fourth switch control signals C1, C2, C4 to a low level, opening the first and third controller switches CS1, CS3 and closing the seventh controller switch S7. In these circumstances, the eighth controller switch CS8 is short circuited, and so the state of the second, fourth and sixth controller switches CS2, CS4, CS6 determine the level of the delay line input signal Din.

Figure 12:
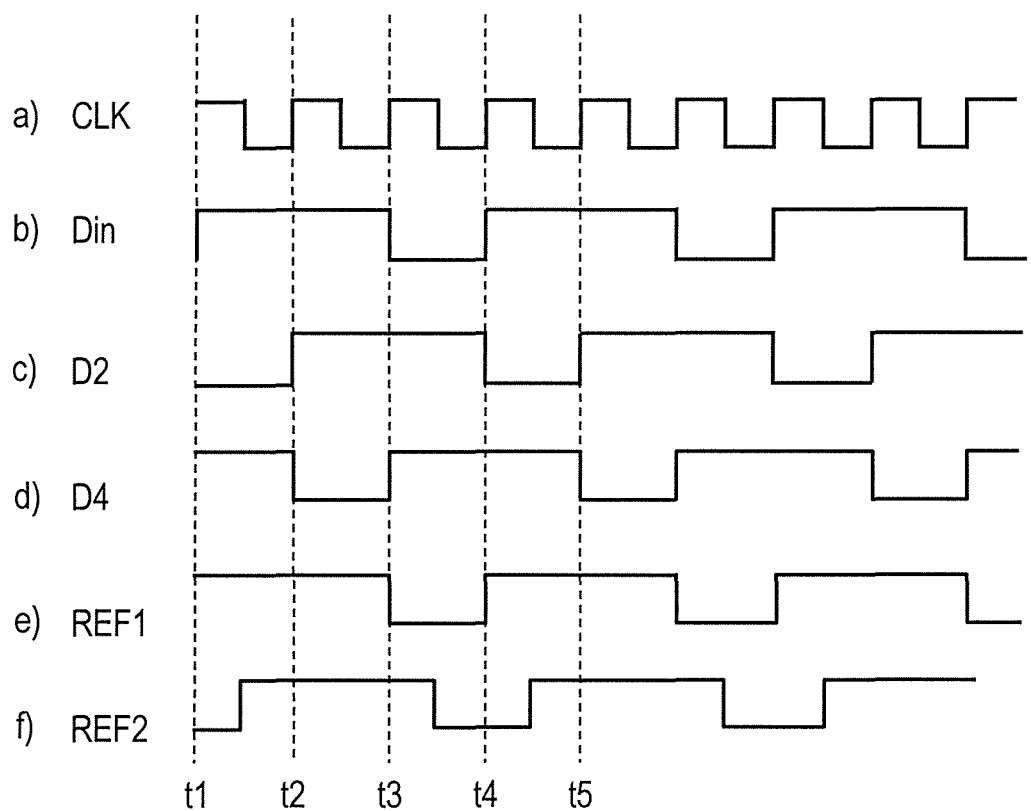
FIG. 12 illustrates signal waveforms relating to the feedback controller of FIG. 11.

Referring to FIG. 12, waveform a) is the clock signal CLK. At time t1 the first and second feedback signals D2, D4, shown at waveforms c) and d) respectively, are at a low level. Consequently, the second and fourth controller switches CS2, CS4 are open and the sixth controller switch CS6 is closed, thereby driving the delay line input signal Din, shown at waveform b), to a high level.

At time t2, the high level delay line input signal Din reaches the output 147b of the second delay stage 143b of the clocked delay line 144', thereby raising the first feedback signal D2 to a high level, which opens the sixth controller switch CS6 and closes the fourth controller switch CS4. In this state, the output 153 of the feedback controller 142 is in a high impedance state with no drive, and so the high level of the delay line input signal Din is maintained.

At time t3, the high level delay line input signal Din reaches the output of the fourth delay stage 145b of the clocked delay line 144', thereby raising the second feedback signal D4 to a high level, whilst the first feedback signal D2 at the output 147b of the second delay stage 143b remains at a high level. Consequently, the second and fourth controller switches CS2, CS4 are closed, and the sixth and eighth controller switches CS6, CS8 are opened, resulting in the delay line input signal Din being pulled to the low level.

At time t4, the first feedback signal D2 changes from a high to a low level, as the low level delay line input signal Din reaches the output 147b of the second delay stage 143b. Consequently, the delay line input signal Din changes to a high level, and the process commences a new cycle. The delay line input signal Din has a period of three cycles of the clock signal CLK, with a duty cycle of two thirds, that is, 67%, and this signal passes along the clocked delay line 144' to the first output 146' of the clocked delay line 144' where it is delivered as the first reference signal REF1, as shown in waveform e) of FIG. 12, and its inverse is delivered at the second output 146" of the clocked delay line 144' as the second reference signal REF2, as shown at waveform f) of FIG. 12.

By controlling the first, second, third and fourth switch control signals C1, C2, C3, C4, different integer division ratios and different duty cycles can be provided.

The operation of the feedback controller 142 of FIG. 11 will now be further described by way of another example with reference to FIG. 13 which illustrates the voltage waveforms of signals in the division stage 140 comprising the clocked delay line 144 described with reference to FIG. 9, and the feedback controller 142 of FIG. 11 for the case of the division stage 140 performing division by three, but, in contrast to the example of FIG. 12, the first and second reference signals REF1, REF2 have a duty cycle of 33%, which can be used, for example, as described below to provide an output signal divided by three from the frequency of the clock signal and having a duty cycle of 50%. In order to enable division by three with a duty cycle of 33%, the decoder 149 sets the first, third and fourth switch control signals C1, C3, C4 of the feedback controller 142 of FIG. 11 to a high level, thereby closing the first controller switch CS1, that is, placing the first controller switch CS1 in a conducting state, and opening the fifth and seventh controller switches CS5, CS7, and sets the second switch control signal C2 to a low level, thereby opening the third controller switch CS3. In these circumstances, the second controller switch CS2 is short circuited, and so the states of only the fourth, sixth and eighth controller switches CS4, CS6, CS8 determine the level of the delay line input signal Din.

Figure 13:
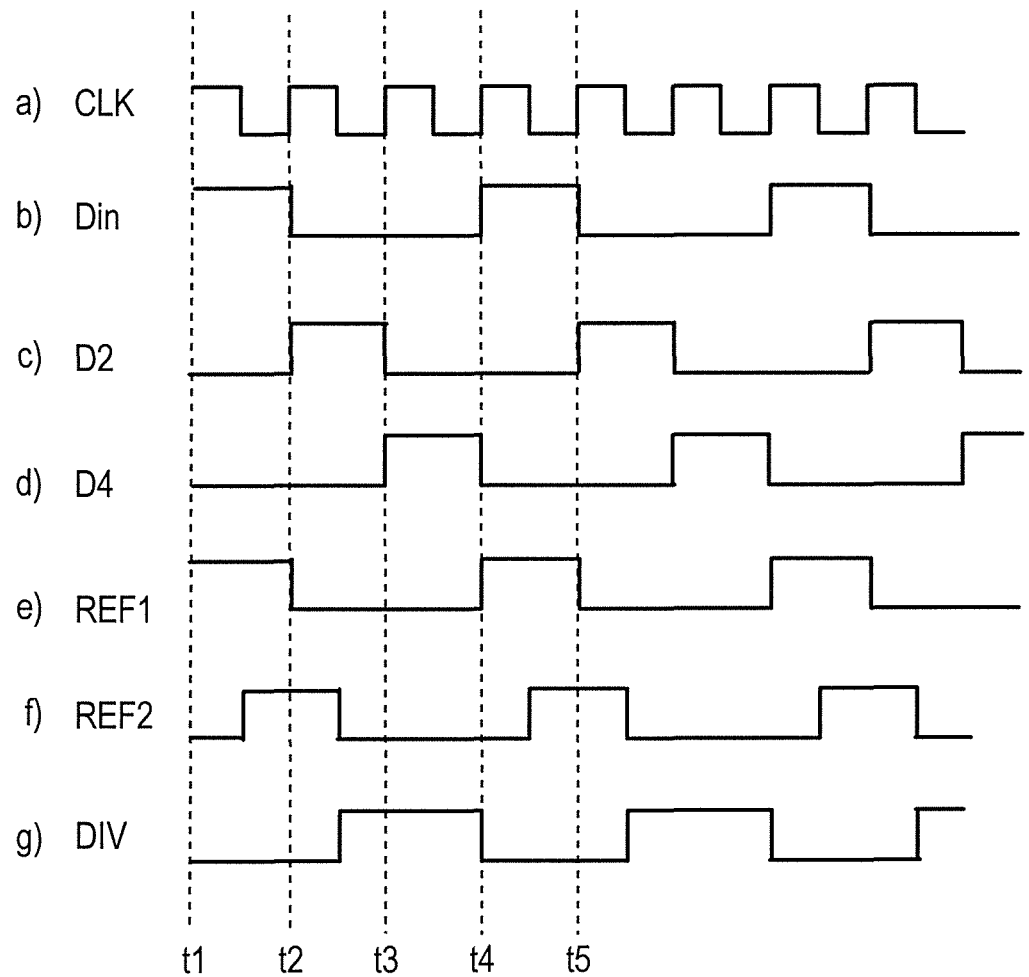
FIG. 13 illustrates signal waveforms for division by three in the division stage, with a 33% duty cycle, enabling division by three in the output signal with a 50% duty cycle.

Referring to FIG. 13, waveform a) is the clock signal CLK. At time t1 the first and second feedback signals D2, D4, shown at waveforms c) and d) respectively, are at a low level. Consequently, the fourth controller switch CS4 is open and the sixth and eighth controller switches CS6, CS8 are closed, thereby driving the delay line input signal Din to a high level, as shown at waveform b).

At time t2, the high level delay line input signal Din reaches the output 147a of the first delay stage 143 of the clocked delay line 144, thereby raising the first feedback signal D2 to a high level, which opens the sixth controller switch CS6 and closes the fourth controller switch CS4. In this state, delay line input signal Din at the output 153 of the feedback controller 142 is pulled low.

At time t3, the high level delay line input signal Din reaches the output 147c of the second delay stage 145 of the clocked delay line 144, thereby raising the second feedback signal D4 to a high level, whilst the first feedback signal D2 at the output 147a of the first delay stage 143 is pulled to a low level as the falling edge of the delay line input signal Din reaches the output 147a of the first delay stage 143. Consequently, the fourth controller switch CS4 is maintained closed, the sixth controller switch CS6 is closed, and the eighth controller switch CS8 is opened, which results in the delay line input signal Din being remaining at the low level.

At time t4, the second feedback signal D4 changes from a high to a low level, as the low level delay line input signal Din reaches the output 147c of the second delay stage 145, and the first feedback signal D2 remains at a low level. Consequently, the fourth controller switch CS4 is opened, the sixth controller switch CS6 remains closed, and the eighth controller switch is closed. As a result, the delay line input signal Din changes to a high level, and the process commences a new cycle. The delay line input signal Din has a period of three cycles of the clock signal CLK, with a duty cycle of one third, that is, 33%, and this signal passes along the clocked delay line 144 and is delivered as the first reference signal REF1, as shown at waveform e) of FIG. 13, at the first reference output 113 of the signal generation stage 110. The second reference signal REF2, corresponding to the first reference signal REF1 delayed by half a period of the clock signal CLK, as shown at waveform f) of FIG. 13, is delivered at the second reference output 114 of the signal generation stage 110. Waveform g) of FIG. 13 is the output signal DIV having a duty cycle of 50%, which is described below in conjunction with FIG. 16.

Figure 14:
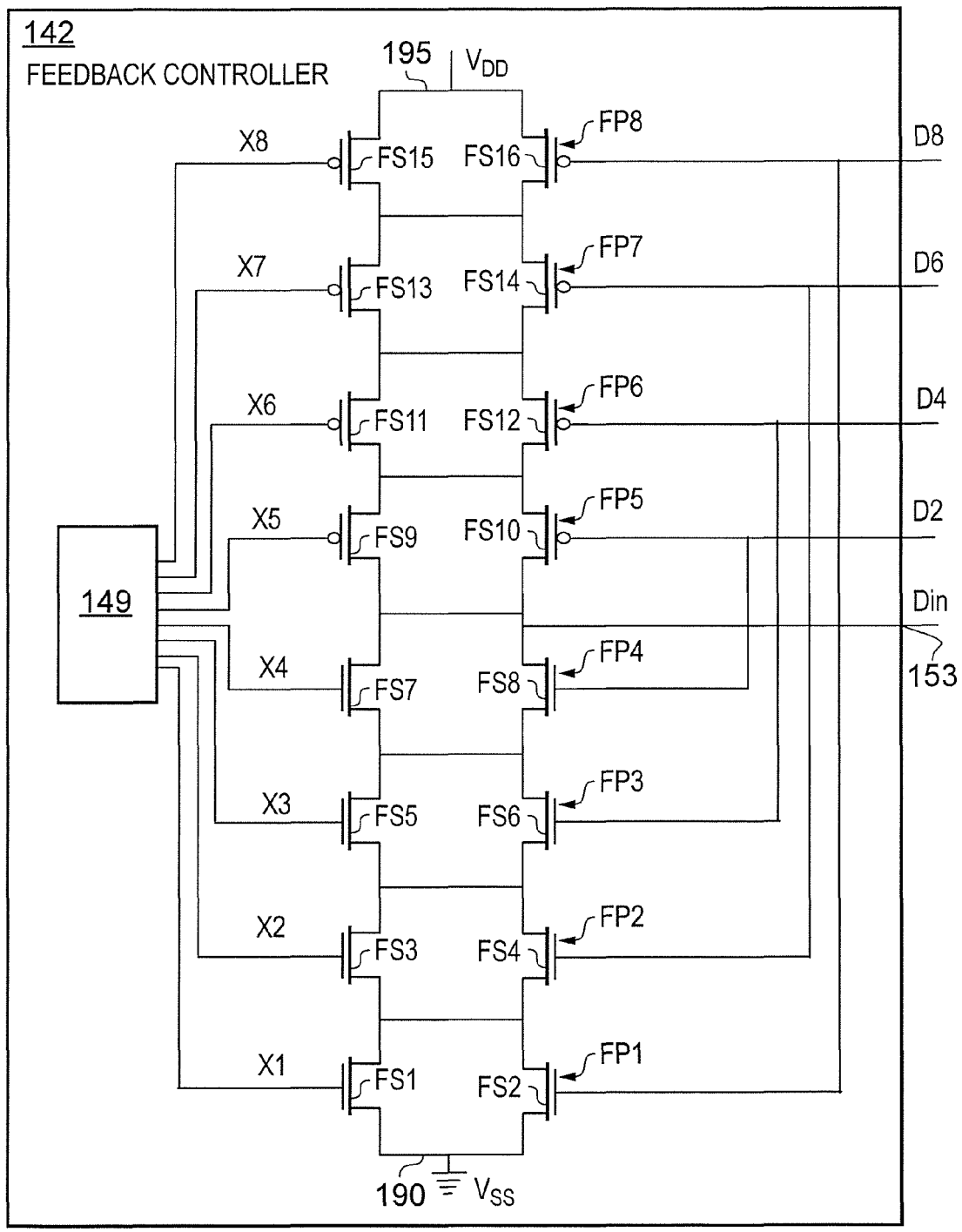
FIG. 14 is a schematic diagram of another embodiment of a feedback controller.

FIG. 14 illustrates another embodiment of the feedback controller 142 suitable for use with a division stage 140 comprising a clocked delay line 144 providing first, second, third and fourth feedback signals D2, D4, D6, D8 from successive delay stages of the clocked delay line 144, thereby providing higher division ratios than the embodiment of the feedback controller 142 illustrated in FIG. 11.

Referring to FIG. 14, the feedback controller 142 comprises a first pair of switches FP1 coupled in parallel, a second pair of switches FP2 coupled in parallel, a third pair of switches FP3 coupled in parallel, an fourth pair of switches FP4 coupled in parallel, a fifth pair of switches FP5 coupled in parallel, a sixth pair of switches FP6 coupled in parallel, a seventh pair of switches FP7 coupled in parallel, and an eighth pair of switches FP8 coupled in parallel. The first, second, third and fourth pairs of switches FP1, FP2, FP3, FP4 are coupled in a series arrangement between the first voltage rail 190 at a relatively low voltage level $V_{ss}$, which may be ground, and the output 153 of the feedback controller 142. The fifth, sixth, seventh and eighth pairs of switches FP5, FP6, FP7, FP8 are coupled in a series arrangement between the second voltage rail 195 at a relatively high voltage level $V_{dd}$ and the output 153 of the feedback controller 142. The first pair of switches FP1 comprises a first controller switch FS1 and a second controller switch FS2. The second pair of switches FP2 comprises a third controller switch FS3 and a fourth controller switch FS4. The third pair of switches FP3 comprises a fifth controller switch FS5 and a sixth controller switch FS6. The fourth pair of switches FP5 comprises a seventh controller switch FS7 and an eighth controller switch FS8. Each of the first to eighth controller switches FS1, FS2, FS3, FS4, FS5, FS6, FS7, FS8 can comprise an NMOS transistor. The fifth pair of switches FP5 comprises a ninth controller switch FS9 and a tenth controller switch FS10. The sixth pair of switches FP6 comprises an eleventh switch FS11 and a twelfth controller switch FS12. The seventh pair of switches FP7 comprises a thirteenth switch FS13 and a fourteenth controller switch FS14. The eighth pair of switches FP8 comprises a fifteenth switch FS15 and a sixteenth switch FS16. Each of the ninth to sixteenth controller switches FS9, FS10, FS11, FS12, FS13, FS14, FS15, FS16 can comprise a PMOS transistor. The first, third, fifth, seventh, ninth, eleventh, thirteenth and fifteenth controller switches FS1, FS3, FS5, FS7, FS9, FS11, FS13, FS15 are arranged to be switched in response to respective first, second, third, fourth, fifth, sixth, seventh and eighth switch control signals X1, X2, X3, X4, X5, X6, X7, X8 applied to respective switch control terminals, which in this particular embodiment are gates of the respective NMOS and PMOS transistors. The first to eighth switch control signals X1 . . . X8 are controlled by the division stage 142 dependent on what integer division ratio and duty cycle the division stage 142 is required to provide. The decoder 149 is coupled to the switch control terminals and maps, as illustrated in FIG. 15, a required division ratio and duty cycle into the first to eighth switch control signals X1 . . . X8 for switching the first, third, fifth, seventh, ninth, eleventh, thirteenth and fifteenth controller switches FS1, FS3, FS5, FS7, FS9, FS11, FS13, FS15. The eighth and tenth controller switches FS8, FS10 are arranged to be switched responsive to the first feedback signal D2. The sixth and twelfth controller switches FS6, FS12 are arranged to be switched responsive to the second feedback signal D4. The fourth and fourteenth controller switches FS4, FS14 are arranged to be switched responsive to the third feedback signal D6. The second and sixteenth controller switches FS2, FS16 are arranged to be switched responsive to the fourth feedback signal D8. The operation of the feedback controller 142 of FIG. 14 is similar to the operation of the feedback controller 142 of FIG. 11, in that the opening and closure of the first, third, fifth, seventh, ninth, eleventh, thirteenth and fifteenth controller switches FS1, FS3, FS5, FS7, FS9, FS11, FS13, FS15 determine which of the second, fourth, sixth, eighth, tenth, twelfth, fourteenth and sixteenth controller switches FS2, FS4, FS6, FS8, FS10, FS12, FS14, FS16 are short circuited, and consequently determine which of the first, second, third and fourth feedback signals D2, D4, D6, D8 affect the delay line input signal Din.

Referring to FIG. 15, there is illustrated a table in which the first row defines the division ratios that can be provided by the division stage 140 using the feedback controller 142 illustrated in FIG. 14, and the second row defines the percentage duty cycles that can be provided for each of the division ratios. The subsequent rows define the required values of the first to eighth switch control signals X1 . . . X8 for each combination of division ratio and duty cycle. The decoder 149 generates the required values of the first to eighth switch control signals X1 . . . X9 in response to the desired division ratio and duty cycle. Other duty cycles can be provided by the synchronisation stage 120 in conjunction with the division stage 140, as illustrated below for the case of division by three with a duty cycle of 50%.

Figure 16:
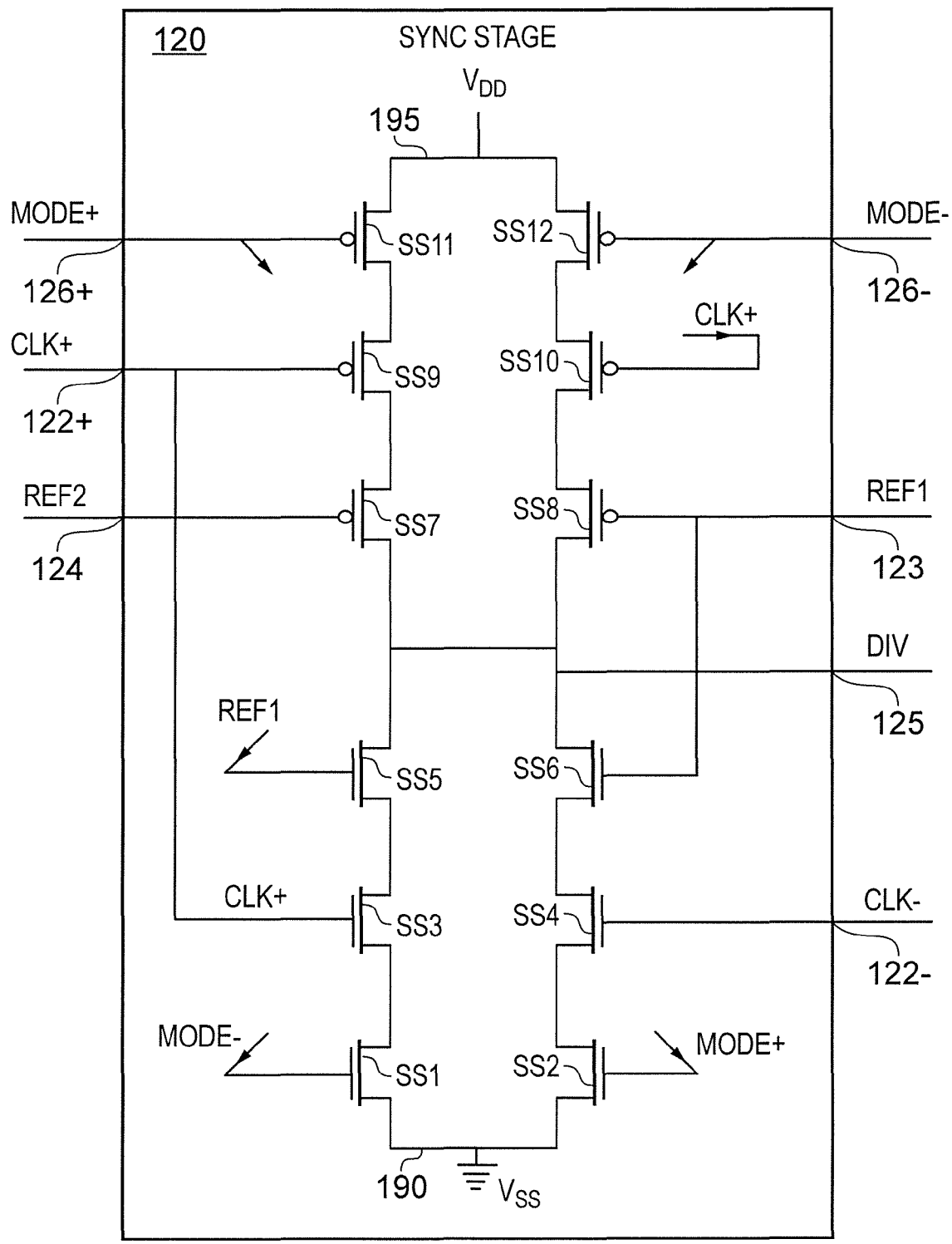
FIG. 16 is a schematic diagram of a synchronisation stage.

Referring to FIG. 16, there is illustrated an embodiment of the synchronisation stage 120 suitable use in a frequency divider providing division by a division ratio of three and an output signal DIV having a 50% duty cycle. In this embodiment of the synchronisation stage 120, the selection signal MODE and the clock signal CLK can be in a differential format, although the same embodiment can be used with a single-ended selection signal MODE and a single-ended clock signal CLK if inverters are used to provide inverted versions of the selection signal MODE and the clock signal CLK.

The synchronisation stage 120 of FIG. 16 comprises first, third and fifth synchronisation switches SS1, SS3, SS5 coupled in a series arrangement between the first voltage rail 190 and the output 125 of the frequency divider 100, and also second, fourth and sixth synchronisation switches SS2, SS4, SS6 coupled in a series arrangement between the first voltage rail 190 and the output 125 of the frequency divider 100, in parallel to the series arrangement of the first, third and fifth synchronisation switches SS1, SS3, SS5. The first, second, third, fourth, fifth and sixth synchronisation switches SS1, SS2, SS3, SS4, SS5, SS6 are NMOS transistors. There are seventh, ninth and eleventh synchronisation switches SS7, SS9, SS11 coupled in a series arrangement between the second voltage rail 195 and the output 125 of the frequency divider 100, and also eighth, tenth and twelfth synchronisation switches SS8, SS10, SS12 coupled in a series arrangement between the second voltage rail 195 and the output 125 of the frequency divider 100, in parallel to the series arrangement of the seventh, ninth and eleventh synchronisation switches SS7, SS9, SS11. The seventh, eighth, ninth, tenth, eleventh and twelfth synchronisation switches SS7, SS8, SS9, SS10, SS11, SS12 switches are PMOS transistors.

The clock input 122 of the synchronisation stage 120 has a differential format comprising first and second differential components of the clock input of the synchronisation stage 122+, 122− for receiving the first and second differential components of the clock signal CLK+, CLK−. Likewise, the mode control input 126 has a differential format, comprising first and second differential components of the mode control input 126+, 126− for receiving first and second differential components of the selection signal MODE+, MODE−.

The first differential component of the clock input of the synchronisation stage 122+ is coupled to control inputs of the third, ninth and tenth synchronisation switches SS3, SS9, SS10, in particular gates of the respective NMOS and PMOS transistors, for receiving the first differential component of the clock signal CLK+. The second differential component of the clock input of the synchronisation stage 122− is coupled to a control input of the fourth synchronisation switch SS4, in particular a gate of the respective NMOS transistor, for delivering the second differential component of the clock signal CLK−. The first differential component of the mode control input 126+ is coupled to control inputs of the second and eleventh synchronisation switches SS2, SS11, in particular gates of the respective NMOS and PMOS transistors, for delivering the first differential component of the selection signal MODE+. The second differential component of the mode control input 126− is coupled to control inputs of the first and twelfth synchronisation switches SS1, SS12, in particular gates of the respective NMOS and PMOS transistors, for delivering the second differential component of the selection signal MODE−. The first reference input 123 is coupled to control inputs of the fifth, sixth and eighth synchronisation switches SS5, SS6, SS8, in particular gates of the respective NMOS and PMOS transistors, for delivering the first reference signal REF1 illustrated in, and described with reference to, FIG. 13, waveform e). The second reference input 124 is coupled to a control input of the seventh synchronisation switch SS7, in particular a gates of the respective PMOS transistor, for delivering the second reference signal REF2 illustrated in, and described with reference to, FIG. 13, waveform f).

In operation, for division by an odd integer, in particular division by three, with a 50% duty cycle, the first differential component of the selection signal MODE+ is set a low level, and therefore the second differential component of the selection signal MODE− is at a high level. Consequently, the first and eleventh synchronisation switches SS1, SS11 are closed, enabling conduction in the third, fifth, seventh and ninth synchronisation switches SS3, SS5, SS7, SS9, and the second and twelfth synchronisation switches SS2, SS12 are open, preventing conduction in the fourth, sixth, eighth and tenth synchronisation switches SS4, SS6, SS8, SS10. In this state, when the first differential component of the clock signal CLK+ is at a high level, the third synchronisation switch SS3 is closed and the ninth synchronisation switch SS9 is open, and the output signal DIV at the signal output of the synchronisation stage 125 is at a low level when the first reference signal REF1 is at a high level and maintains its previous value when the first reference signal REF1 is at a low level. When the first differential component of the clock signal CLK+ is at a low level, the third synchronisation switch SS3 is open and the ninth and tenth synchronisation switches SS9, SS10 are closed, and the output signal DIV at the signal output of the synchronisation stage 125 is at a high level when the second reference signal REF2 is at a low level and maintains its previous value when the second reference signal REF2 is at a high level. In this way, the clock signal CLK determines whether the output signal DIV is dependent on the first or second reference signal REF1, REF2. The resulting output signal DIV is illustrated in FIG. 13, waveform f), and has a duty cycle of 50%.

The order of the first, third and fifth synchronisation switches SS1, SS3, SS5 coupled in the series arrangement between the first voltage rail 190 and the output 125 of the frequency divider 100, in the embodiment of the synchronisation stage 120 illustrated in FIG. 16, is not essential and other orders may be employed instead. Likewise, the second, fourth and sixth synchronisation switches SS2, SS4, SS6 coupled in the series arrangement between the first voltage rail 190 and the output 125 of the frequency divider 100 may be arranged in a different order, the seventh, ninth and eleventh synchronisation switches SS7, SS9, SS11 coupled in the series arrangement between the second voltage rail 195 and the output 125 of the frequency divider 100 may be arranged in a different order, and the eighth, tenth and twelfth synchronisation switches SS8, SS10, SS12 coupled in the series arrangement between the second voltage rail 195 and the output 125 of the frequency divider 100 may be arranged in a different order, As described, for the synchronisation stage 120 illustrated in FIG. 16, the selection signal MODE is set to a low level when a division ratio of three is employed. More generally, the selection signal MODE can be set to a low level whenever a division ratio of an odd number is required for the frequency divider 100. In this case, because the second and twelfth synchronisation switches SS2, SS12 are open, that is, in a non-conducting state, and the first and eleventh synchronisation switches SS1, SS11 are closed, that is, in a conducting state, the transitions in the output signal DIV are determined by the operation of the left hand branch of the synchronisation stage 120 of FIG. 16, in particular by operation of the third, fifth, seventh and ninth synchronisation switches SS3, SS5, SS7, SS9. The synchronisation stage 120 illustrated in FIG. 16 can also be used when a division ratio of an even number is required for the frequency divider 100, in which case the selection signal MODE is set to a high level, the first and eleventh synchronisation switches SS1, SS11 are open, and the transitions in the output signal DIV are determined by the operation of the right hand branch, in particular by operation of the fourth, sixth, eighth and tenth synchronisation switches SS4, SS6, SS8, SS10.

In a variation of the synchronisation stage 120 illustrated in FIG. 16, in which the selection signal MODE is set to a constant low or high level, the signals applied to the control inputs of first, third, fifth, seventh, ninth and eleventh synchronisation switches may be swapped with the signals applied to the control inputs of, respectively, the second, fourth, sixth, eighth, tenth and twelfth synchronisation switches.

Figure 17:
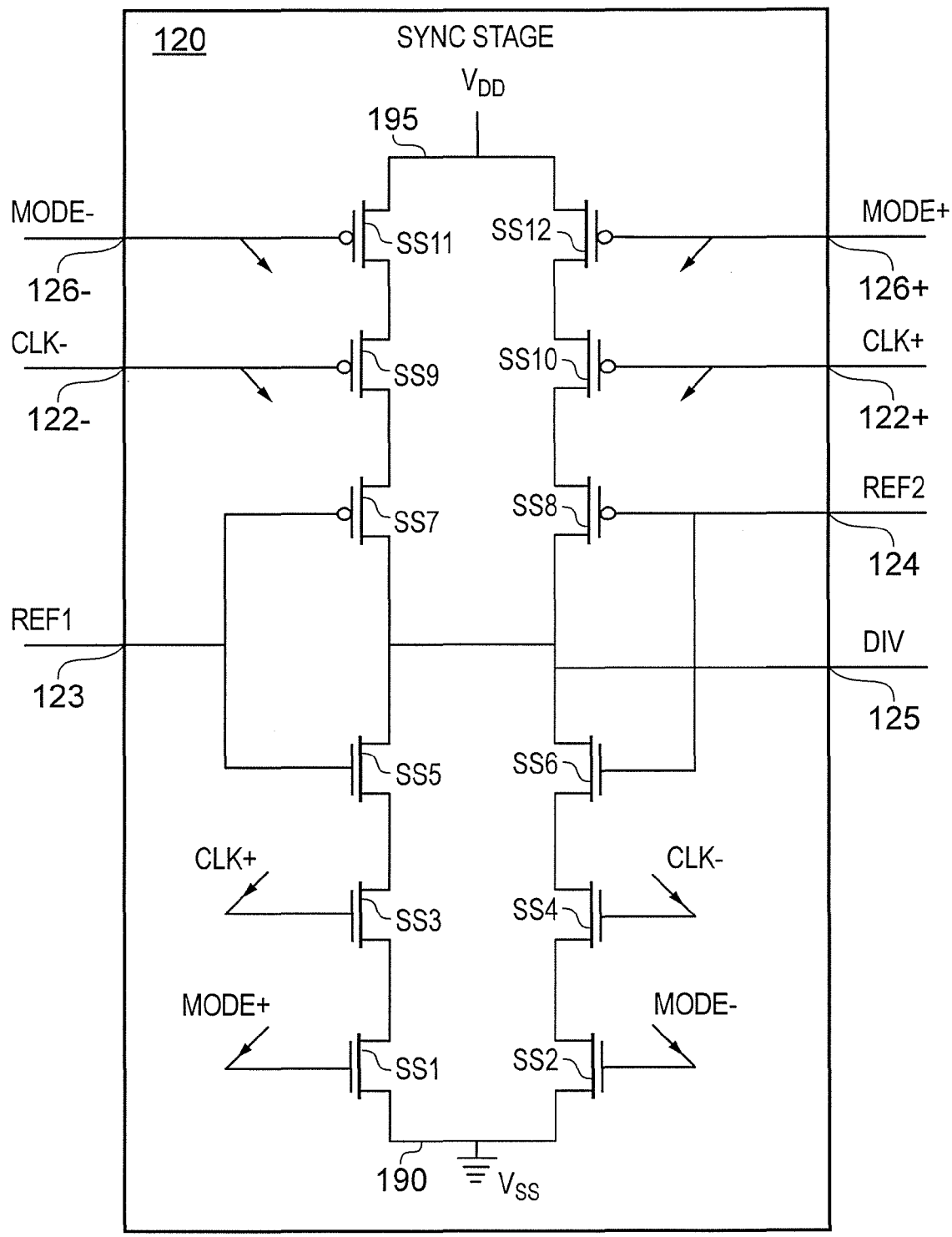
FIG. 17 is a schematic diagram of another embodiment of a synchronisation stage.

Referring to FIG. 17, there is illustrated another embodiment of the synchronisation stage 120 suitable for use with the selection signal MODE and the clock signal CLK in a differential format, although the same embodiment can be used with a single-ended selection signal MODE and a single-ended clock signal CLK if inverters are used to provide inverted versions of the selection signal MODE and the clock signal CLK. The synchronisation stage 120 of FIG. 17 comprises the same elements as the synchronisation stage illustrated in FIG. 16, but has some of the signals connected to the elements differently. The first differential component of the clock input of the synchronisation stage 122+ is coupled to the control inputs of the third and tenth synchronisation switches SS3, SS10, in particular gates of the respective NMOS and PMOS transistors, for delivering the first differential component of the clock signal CLK+. The second differential component of the clock input of the synchronisation stage 122− is coupled to the control inputs of the fourth and ninth synchronisation switches SS4, SS9, in particular gates of the respective NMOS and PMOS transistors, for delivering the second differential component of the clock signal CLK−. The first differential component of the mode control input 126+ is coupled to control inputs of the first and ninth synchronisation switches SS1, SS9, in particular gates of the respective NMOS and PMOS transistors, for delivering the first differential component of the selection signal MODE+. The second differential component of the mode control input 126− is coupled to control inputs of the first and twelfth synchronisation switches SS1, SS12, in particular gates of the respective NMOS and PMOS transistors, for delivering the second differential component of the selection signal MODE−. The first reference input 123 is coupled to control inputs of the fifth and seventh synchronisation switches SS5, SS7, in particular gates of the respective NMOS and PMOS transistors, for delivering the first reference signal REF1, and the signal output 125 of the synchronisation stage 120 is coupled to control inputs of the sixth and eighth synchronisation switches SS6, SS8, in particular gates of the respective NMOS and PMOS transistors, for delivering the second reference signal REF2.

The order of the first, third and fifth synchronisation switches SS1, SS3, SS5 coupled in the series arrangement between the first voltage rail 190 and the output 125 of the frequency divider 100, in the embodiment of the synchronisation stage 120 illustrated in FIG. 17, is not essential and other orders may be employed instead. Likewise, the second, fourth and sixth synchronisation switches SS2, SS4, SS6 coupled in the series arrangement between the first voltage rail 190 and the output 125 of the frequency divider 100 may be arranged in a different order, the seventh, ninth and eleventh synchronisation switches SS7, SS9, SS11 coupled in the series arrangement between the second voltage rail 195 and the output 125 of the frequency divider 100 may be arranged in a different order, and the eighth, tenth and twelfth synchronisation switches SS8, SS10, SS12 coupled in the series arrangement between the second voltage rail 195 and the output 125 of the frequency divider 100 may be arranged in a different order, In operation, when the first differential component of the selection signal MODE+ is at a low level, and therefore the second differential component of the selection signal MODE− is at a high level, the first and eleventh synchronisation switches SS1, SS11 are closed, enabling conduction in the third, fifth, seventh and ninth synchronisation switches SS3, SS5, SS7, SS9, and the second and twelfth synchronisation switches SS2, SS12 are open, preventing conduction in the fourth, sixth, eighth and tenth synchronisation switches SS4, SS6, SS8, SS10. In this state, when the first differential component of the clock signal CLK+ is at a high level, the third and ninth synchronisation switches SS3, SS9 are closed, and the output signal DIV at the signal output of the synchronisation stage 125 corresponds to an inversion of the first reference signal REF1. When the first differential component of the clock signal CLK+ is at a low level, the third and ninth synchronisation switches SS3, SS9 are open, and the output signal DIV at the signal output of the synchronisation stage 125 maintains its previous value.

Conversely, when the first differential component of the selection signal MODE+ is at a high level, and therefore the second differential component of the selection signal MODE− is at a low level, the first and eleventh synchronisation switches SS1, SS11 are open, preventing conduction of current in the third, fifth, seventh and ninth synchronisation switches SS3, SS5, SS7, SS9, and the second and twelfth synchronisation switches SS2, SS12 are closed, enabling conduction in the fourth, sixth, eighth and tenth synchronisation switches SS4, SS6, SS8, SS10. In this state, when the first differential component of the clock signal CLK+ is at a low level, the fourth and tenth synchronisation switches SS4, SS10 are closed, and the output signal DIV at the signal output of the synchronisation stage 125 corresponds to an inversion of the second reference signal REF2. When the first differential component of the clock signal CLK+ is at a high level, the fourth and tenth synchronisation switches SS4, SS10 are open, and the output signal DIV at the signal output of the synchronisation stage 125 maintains its previous value. In this way, the selection signal MODE determines when the output signal DIV corresponds to an inversion of the first reference signal REF1 and when the output signal DIV corresponds to an inversion of the second reference signal REF2. When the first differential component of the selection signal MODE+ is at a low level, in which case it is the first reference signal REF1 that is used to determine the level of the output signal DIV, the level of the output signal DIV is set whilst the first differential component of the clock signal CLK+ is at a high level, and more particularly at the rising transitions in that signal. When the first differential component of the selection signal MODE+ is at a high level, in which case it is the second reference signal REF2 that is used to determine the level of the output signal DIV, the level of the output signal DIV is set whilst the second differential component of the clock signal CLK− is at a low level, and more particularly at the falling transitions in that signal.

Figure 18:
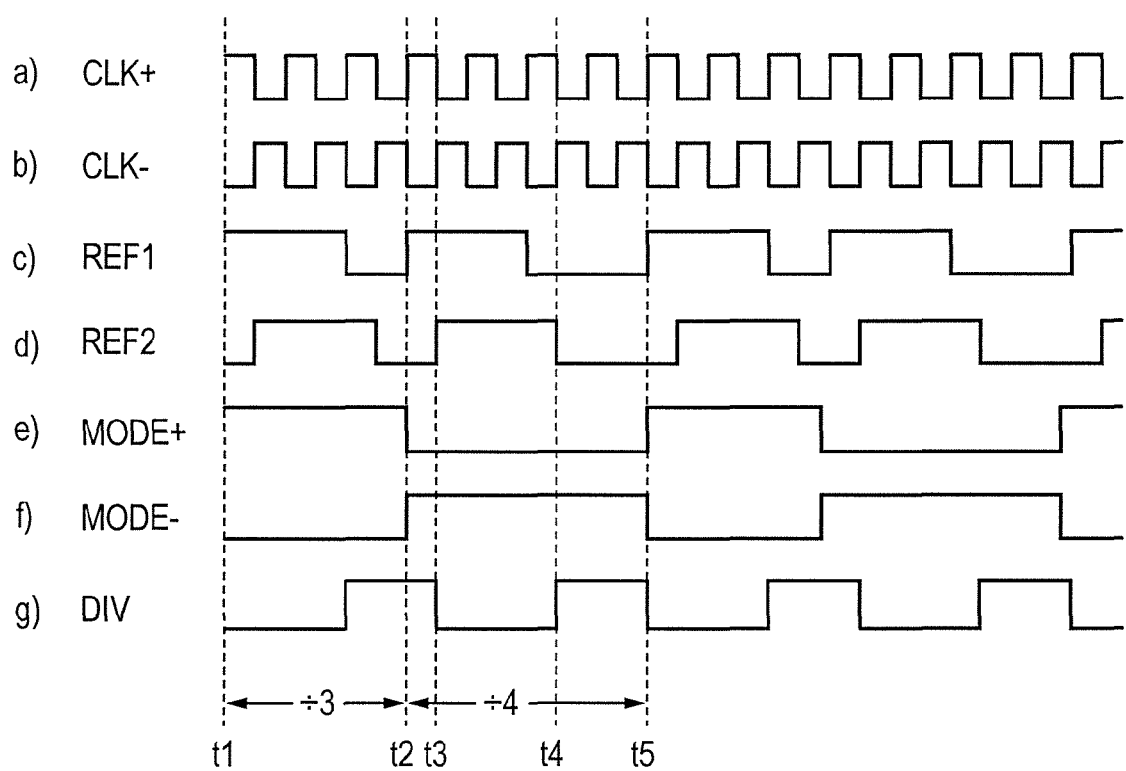
FIG. 18 illustrates signal waveforms for division by 3.5.

If the frequency divider 100 is used for integer division, the selection signal MODE has a constant value, which may be either a low or a high level, according to whether the output signal DIV is to be derived from the first or second reference signal REF1, REF2. If the frequency divider 100 is used for non-integer division, the selection signal MODE switches between a low and high value at the completion of each cycle of the first reference signal REF1 in some embodiments, or between a low and high value at the completion of each cycle of the output signal DIV in other embodiments. The operation of the frequency divider 100 comprising the synchronisation stage 120 illustrated in FIG. 17, for non-integer division is illustrated in FIG. 18 for the case of a division ratio of 3.5 in which the division stage 140 is switched between division by 3, as described above with reference to FIG. 12, and division by 4, in response to the selection signal MODE. For division using a division ratio of 4, the feedback controller 142 determines the delay line input signal Din solely on the second feedback signal D4.

Referring to FIG. 18, initially at time t1, the first differential component of the selection signal MODE+, which is illustrated at waveform e), is set to a high level, in response to which the feedback controller 142 establishes division by three in the division stage 140. Between times t1 and t2, waveforms a), c) and d) reproduce from FIG. 12, the waveforms of the clock signal CLK, or equivalently the first differential component of the clock signal CLK+, and one cycle of the first and second reference signals REF1, REF2 for division by using a division ratio of three and a 67% duty cycle. Waveform b) illustrates the second differential component of the clock signal CLK−. Waveforms e) and f) illustrate the first and second differential components of the selection signal MODE+, MODE−, which switch levels at the completion of each cycle of the first reference signal REF1. Therefore, transitions in the selection signal MODE take place at times t1 and t2.

During the period t1 to t2, the first differential components of the selection signal MODE+ has a high level, and therefore during this period the values of the output signal DIV corresponds to an inversion of the first reference signal REF1 by operation of the synchronisation stage 120. At time t2, the rising edge of the first reference signal REF1 signifies the completion of a cycle of first reference signal REF1, and consequently the selection signal MODE switches level. With the first differential component of the selection signal MODE+ at a low level, the signal output of the synchronisation stage 125 is in a high impedance state due to the opening of the second and twelfth synchronisation switches SS2, SS12 and so its value of the preceding half period of the clock signal CLK is maintained, that is, a high value. In effect, this action extends the period of the output signal DIV established by the division stage 140 operating with a division ratio of three, by half a period of the clock signal CLK, that is, T/2, to time t3. In addition, in response to the selection signal MODE switching, the feedback controller 142 adapts the division stage 140 to divide by four, which causes the period of the first and second reference signals to increase by one period T of the clock signal.

At time t3, the rising edge of the second reference signal REF2 causes the value of the output signal DIV to switch to a low value, and at time t4, the falling edge of the second reference signal REF2 causes the value of the output signal DIV to switch to a high value. At time t5, the rising edge of the first reference signal REF1 signifies the completion of a cycle of first reference signal REF1 with the division stage 140 dividing by four, and consequently the selection signal MODE switches level. With the first differential component of the selection signal MODE+ at a high level, the output signal DIV reverts, by operation of the synchronisation stage 120, to corresponding to an inversion of the first reference signal REF1, and therefore switches to a high value. In effect, this action truncates the period of the output signal DIV established by the division stage 140 operating with a division ratio of four, by half a period of the clock signal CLK. Although the division ratio of the division stage 140 alternates between three and four, changing at the completion of each cycle of the first reference signal REF1, the output signal DIV has a constant period of 3.5 times the period T of the clock signal CLK, and the duty cycle is constant at 2/3.5, that is, 57%. In this way, division by 3.5 is provided, and the noise level of the output signal DIV is dependent on the noise level of the clock signal CLK, without significant noise being added by the division by 3.5. In other embodiments, the division stage 140 can switch between other consecutive integer values, that is, can alternately increase and decrease the division ratio by unity, resulting in a division ratio midway between the consecutive integer values. For example, switching between division ratios of four and five provides division by 4.5, switching between division ratios of five and six provides division by 5.5, and switching between division ratios of six and seven provides division by 6.5. More generally, the division stage 140 can switch between consecutive or non-consecutive integer values, that is, can alternately increase and decrease the integer division ratio, in response to the selection signal, between any two consecutive or non-consecutive integer values, resulting in a division ratio midway between the two integer values.

Figure 19:
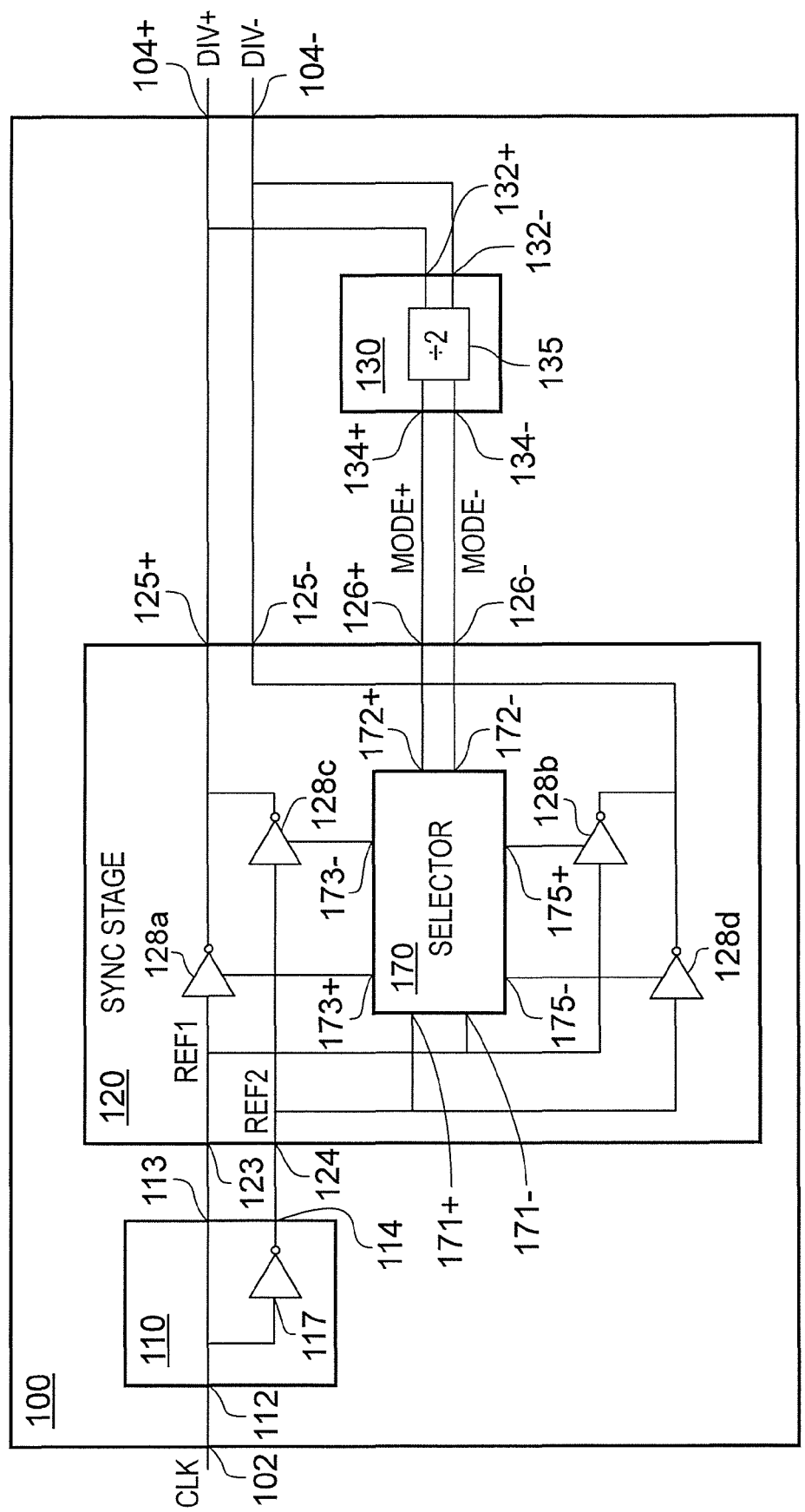
FIG. 19 is a schematic diagram of a frequency divider for division by 1.5 and showing further embodiments of the signal generation stage and synchronisation stage for differential signals.

Referring to FIG. 19, an embodiment of the frequency divider 100 for division by 1.5 comprises the elements described with reference to FIGS. 1 and 2. The first input 112 of the signal generation stage 110 is coupled to the first reference output 113 for delivering the clock signal CLK as the first reference signal REF1. The first inverter 117 is coupled between first input 112 of the signal generation stage 110 and the second reference output 114 for delivering the inverse clock signal –CLK as the second reference signal REF2. Alternatively, if the clock CLK is available in a differential form, the inverse clock signal –CLK is available for use directly as the second reference signal REF2, and the first inverter 117 can be dispensed with. The synchronisation stage 120 of FIG. 19 comprises a first tri-state inverter 128a and a second tri-state inverter 128b each having a first input coupled to the first reference input 123 and an output coupled to the respective signal output components 125+, 125– of the signal output 125 of the synchronisation stage 120. The synchronisation stage 120 also comprises a third tri-state inverter 128c and a fourth tri-state inverter 128d each having a first input coupled to the second reference input 124 and an output coupled to the respective signal output components 125+, 125– of the signal output 125 of the synchronisation stage 120. The synchronisation stage 120 comprises a selector stage 170 having a first selector stage input 171+ and a second selector stage input 171– coupled to respectively the first and second reference inputs 123, 124, and a third selector stage input 172+ and a fourth selector stage input 172– coupled to respectively the first and second differential components of the mode control input 126+, 126– for receiving the first and second differential components of the selection signal MODE+, MODE–. The selector stage 170 has a first selector stage output 173+ coupled to a second input of the first tri-state inverter 128a for selecting the first reference signal REF1 by determining whether the output of the first tri-state inverter 128a conveys an inverse of the first reference signal REF1 or has a high impedance state, a second selector stage output 175+ coupled to a second input of the second tri-state inverter 128b for selecting the first reference signal REF1 by determining whether the output of the second tri-state inverter 128b conveys an inverse of the first reference signal REF1 or has a high impedance state, a third selector stage output 173– coupled to a second input of the third tri-state inverter 128c for selecting the second reference signal REF2 by determining whether the output of the third tri-state inverter 128c conveys an inverse of the second reference signal REF2 or has a high impedance state, and a fourth selector stage output 175– coupled to a second input of the fourth tri-state inverter 128d for selecting the second reference signal REF2 by determining whether the output of the fourth tri-state inverter 128d conveys an inverse of the second reference signal REF2 or has a high impedance state. The mode control stage 130, comprising the divide-by-two stage 135, has the differential input components 132+, 132– of the first input 132 coupled to the differential output components 104+, 104– of the frequency divider 100, and generates the first and second differential components of the selection signal MODE+, MODE–.

Figure 20:
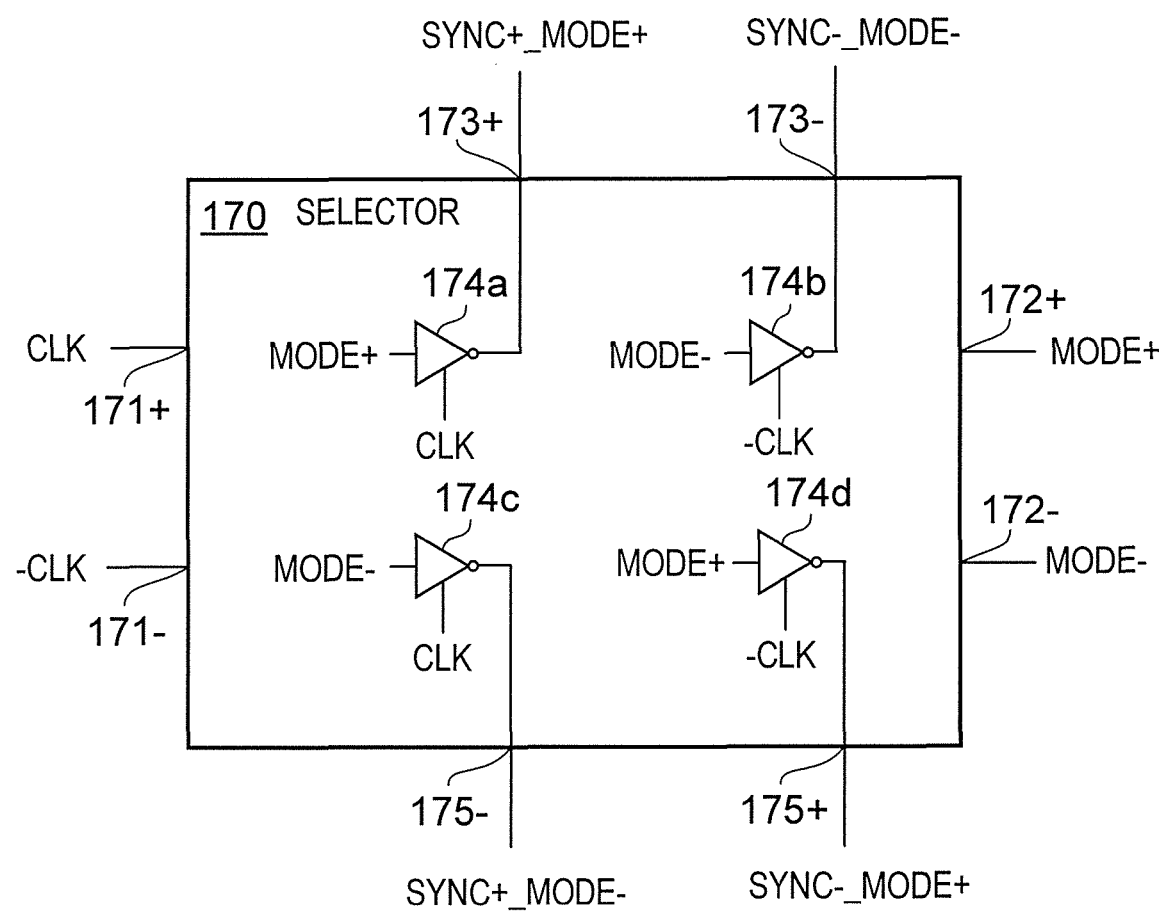
FIG. 20 is a schematic diagram of the selector stage of the frequency divider of FIG. 19.

Referring to FIG. 20, the selector stage 170 comprises a fifth tri-state inverter 174a having a first input coupled to the third selector stage input 172+ for receiving the first differential component of the selection signal MODE+, a second input coupled to the first selector stage input 171+ for receiving the clock signal CLK, and an output coupled to the first selector stage output 173+ for delivering a signal denoted SYNC+_MODE+. The selector stage 170 comprises a sixth tri-state inverter 174b having a first input coupled to the fourth selector stage input 172– for receiving the second differential component of the selection signal MODE–, a second input coupled to the second selector stage input 171– for receiving the inverse clock signal –CLK, and an output coupled to the third selector stage output 173– for delivering a signal denoted SYNC–_MODE–. The selector stage 170 comprises a seventh tri-state inverter 174c having a first input coupled to the second selector stage input 172– for receiving the second differential component of the selection signal MODE–, a second input coupled to the first selector stage input 171+ for receiving the clock signal CLK, and an output coupled to the fourth selector stage output 175– for delivering a signal denoted SYNC+_MODE–. The selector stage 170 comprises an eighth tri-state inverter 174d having a first input coupled to the third selector stage input 172+ for receiving the first differential component of the selection signal MODE+, a second input coupled to the second selector stage input 171– for receiving the inverse clock signal –CLK, and an output coupled to the second selector stage output 175+ for delivering a signal denoted SYNC–_MODE+. The level of the clock signal CLK and inverse clock signal –CLK determines whether the outputs of the fifth, sixth, seventh and eighth tri-state inverters 174a, 174b, 174c, 174d convey the inverse of the first or second differential components of the selection signal MODE+, MODE– present at their respective first inputs, or instead have a high impedance state. Therefore, in operation, the selector stage 170 determines, dependent on the clock signal CLK and the selection signal MODE, whether the first reference signal REF1, equal to the clock signal CLK, or the second reference signal REF2, equal to the inverse clock signal –CLK, is delivered at the first signal output component 125+ of the signal output 125 of the synchronisation stage 120, with the second reference signal REF1, equal to the inverse clock signal –CLK, or the first reference signal REF1, equal to the clock signal CLK, being delivered at the second signal output component 125– of the signal output 125 of the synchronisation stage 120. In this way, the fifth and eighth tri-state inverters 174a, 174d each synchronise the selecting of the first reference signal REF1 to a transition of the clock signal CLK, and the sixth and seventh tri-state inverters 174b, 174c each synchronise the selecting of the second reference signal REF2 to an opposite transition of the clock signal CLK.

Figure 21:
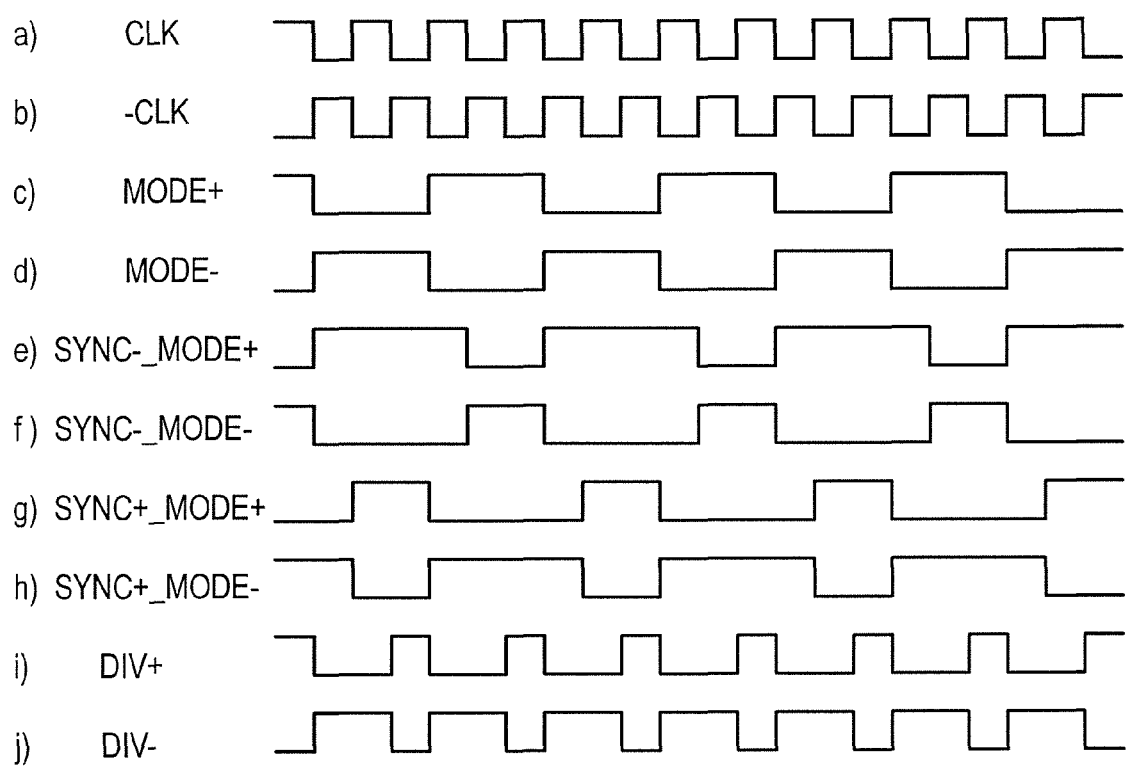
FIG. 21 illustrates signal waveforms in the frequency divider of FIG. 19.

Referring to FIG. 21, there are illustrated waveforms of signals in the frequency divider 100 of FIG. 19. The signals SYNC−_MODE+ and SYNC−_MODE− change state at rising edges of the inverse clock signal −CLK, and the signals SYNC+_MODE+ and SYNC+_MODE− change stage at rising edges of the clock signal CLK. When the signal SYNC−_MODE+ has a low level and the signal SYNC−_MODE− has a high level, the second and third tri-state inverters 128b, 128c are conducting and therefore deliver the inverse clock signal −CLK to the first signal output component 125+ of the signal output 125 of the synchronisation stage 120, as the first differential output signal component DIV+, and deliver the clock signal CLK to the second signal output component 125− of the signal output 125 of the synchronisation stage 120, as the second differential output signal component DIV−. When the signal SYNC+_MODE+ has a high level and the signal SYNC+_MODE− has a low level, the first and fourth tri-state inverters 128a, 128d are conducting and therefore deliver the clock signal CLK to the first signal output component 125+ of the signal output 125 of the synchronisation stage 120, as the first differential output signal component DIV+, and deliver the inverse clock signal −CLK to the second signal output component 125− of the signal output 125 of the synchronisation stage 120, as the second differential output signal component DIV−. Otherwise, the outputs of the first, second third and fourth tri-state inverters 128a, 128b, 128c, 128d are in a high impedance state and the signals delivered to the first and second differential output signal components DIV+, DIV− are maintained at their previous levels.

Figure 22:
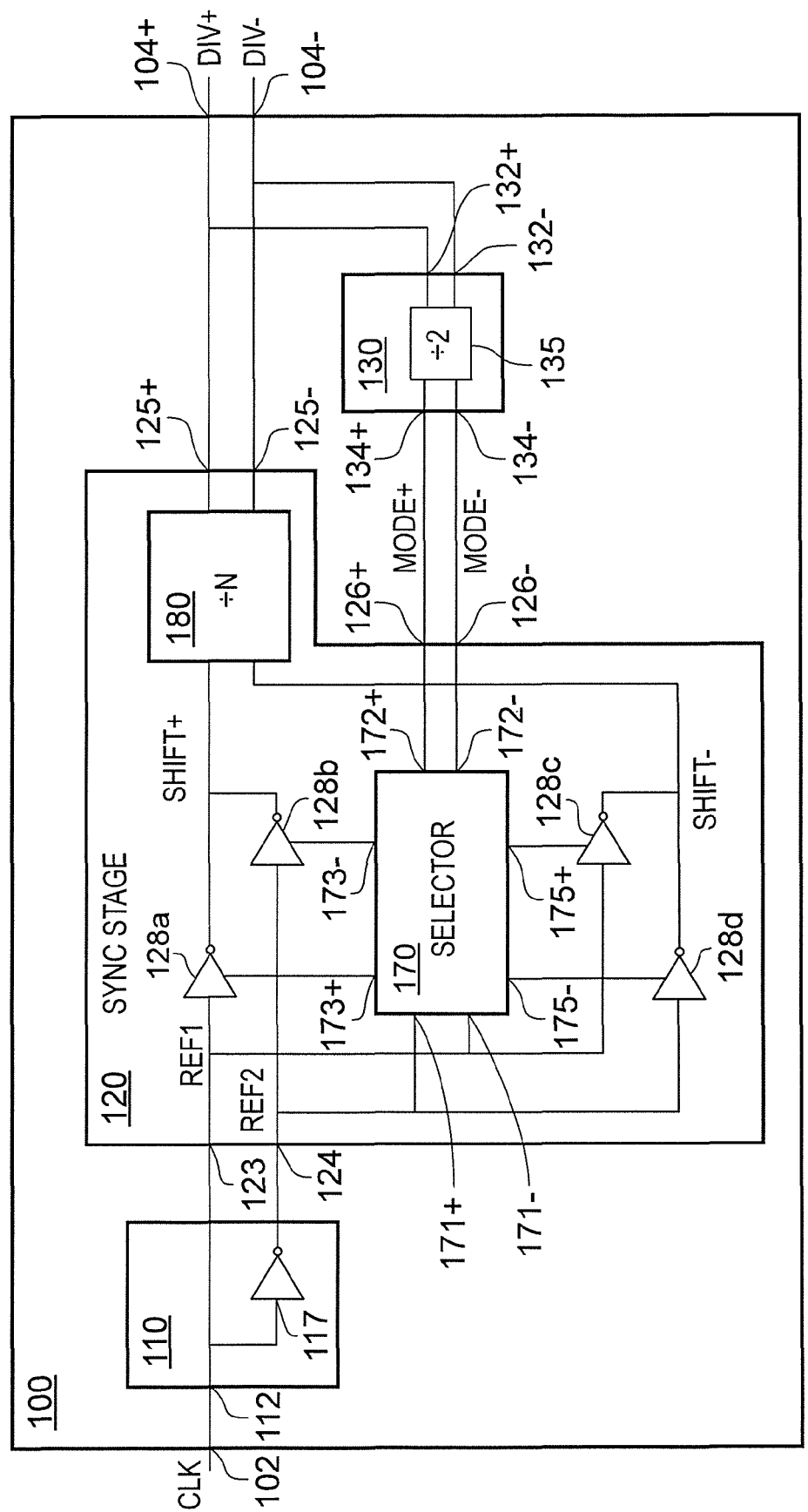
FIG. 22 is a schematic diagram of a frequency divider for division by N.5 where N is an integer greater than unity.
Figure 23:
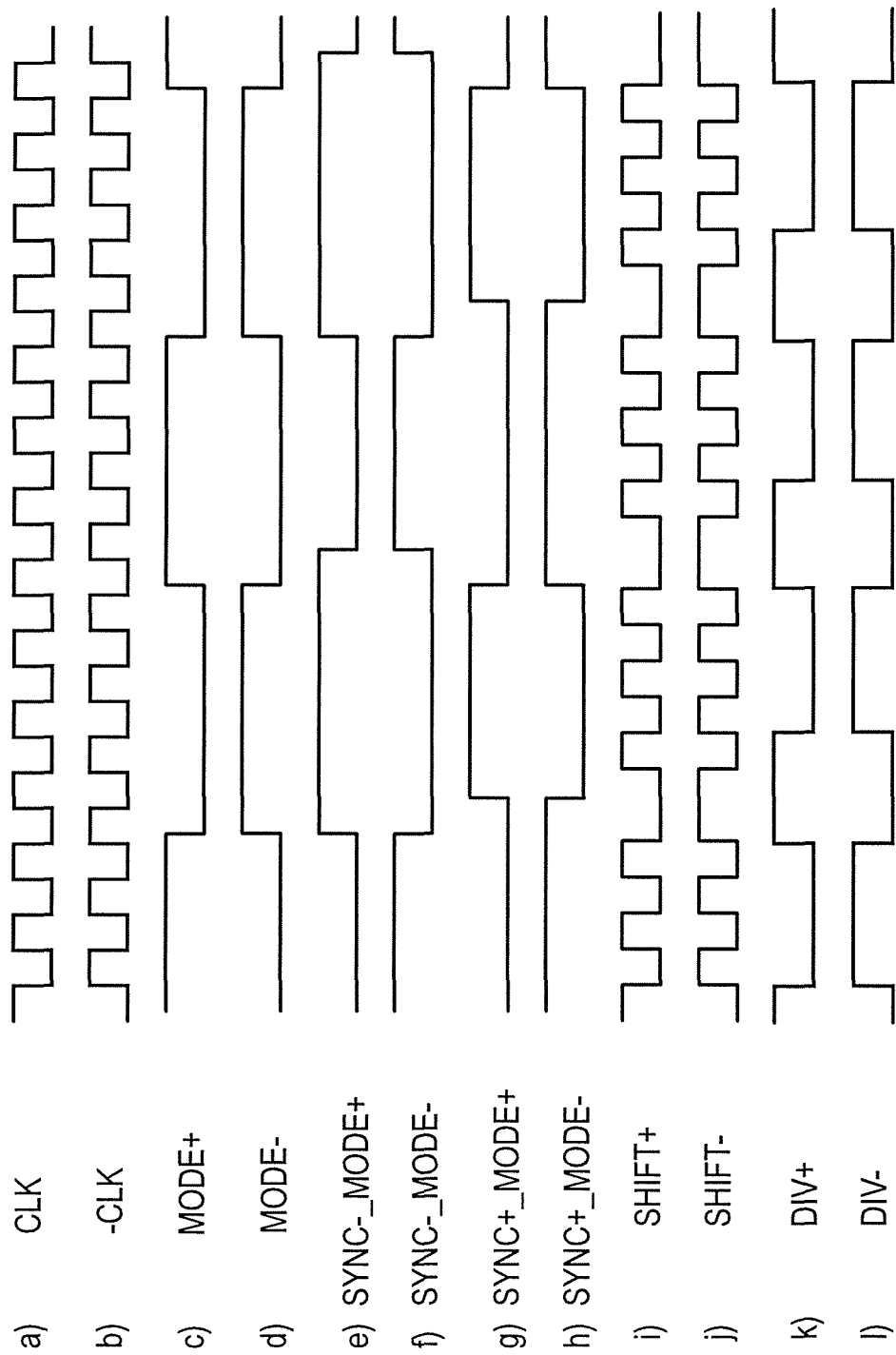
FIG. 23 illustrates signal waveforms in the frequency divider of FIG. 22.

Referring to FIG. 22, an embodiment of the frequency divider 100 for division by N.5, where N is an integer greater than unity, comprises the elements described with reference to FIGS. 1, 2 and 18, but the synchronisation stage 120 additionally comprises a division stage 180 coupled between the output of the first tri-state inverter 128a and the first signal output component 125+ of the signal output 125, and between the output of the fourth tri-state inverter 128d and the second signal output component 125− of the signal output 125. For division by N.5, the division ratio of the division stage 180 is set to a constant value N, and a first differential component, denoted SHIFT+, of an intermediate signal SHIFT, is delivered to the division stage 180 by the first and second tri-state inverters 128a, 128b to be divided by N. The first differential component of the intermediate signal SHIFT+ is switched between inversions of the first and second reference signals REF1, REF2 by the selector stage 170. Likewise, a second differential component, denoted SHIFT−, of the intermediate signal SHIFT, is delivered to the division stage 180 by the third and fourth tri-state inverters 128c, 128d to be divided by N. The second differential component of the intermediate signal SHIFT− is switched between inversions of the first and second reference signals REF1, REF2 by the selector stage 170. In this way, the clocking of the division stage 180 is delayed by half a period of the clock once per cycle of the frequency of the output signal DIV. Signal waveforms for the frequency divider 100 of FIG. 22 are illustrated in FIG. 23 for the case of division by 3.5, that is, for N=3 and where the division stage 180 divides by three.

Figure 24:
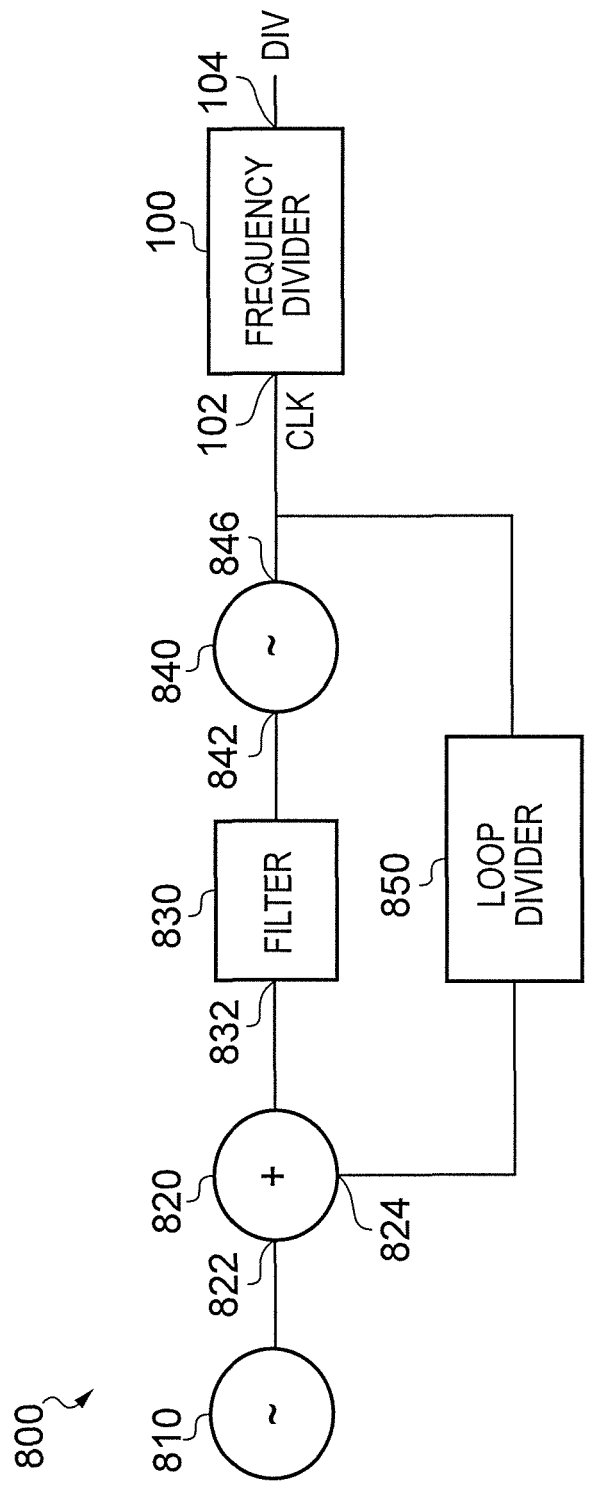
FIG. 24 is a schematic diagram of a frequency synthesiser comprising a frequency divider.

Referring to FIG. 24, a frequency synthesiser 800 comprises a reference oscillator 810 having an output coupled to a first input 822 of a phase detector 820. A voltage controlled oscillator (VCO) 840 has an output 846, which delivers the clock signal CLK, coupled to the input 102 of the frequency divider 100 in accordance with the present disclosure. The output 846 of the VCO 840 is coupled to a second input 824 of the phase detector 820 by means of a loop divider 850. An output of the phase detector 820, which delivers an error signal indicative of the phase difference between a reference oscillator signal generated by the reference oscillator 810 and the clock signal CLK after division by the loop divider 850, is coupled to an input 832 of a low pass filter 830. An output of the low pass filter 830 is coupled to a control input 842 of the VCO 840 for controlling the frequency of the VCO 840 in response to the filtered error signal. The output signal DIV delivered at the output 104 of the frequency divider 100 may be used, for example, as a local oscillator signal in a wireless communications apparatus for up-converting a signal to be transmitted or for down-converting a received signal.

Figure 25:
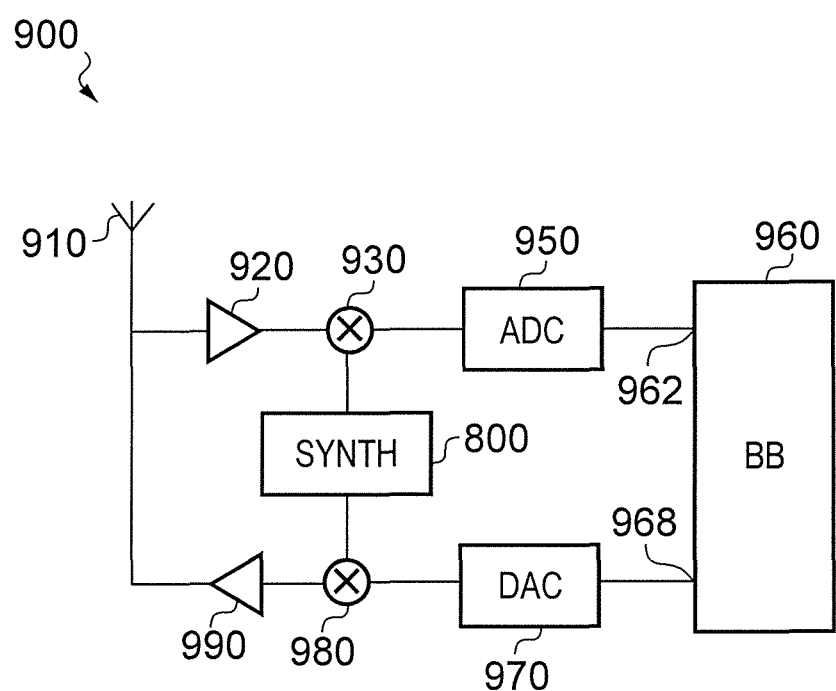
FIG. 25 is a schematic diagram of a wireless communication apparatus comprising the frequency divider.

Referring to FIG. 25, a wireless communications apparatus 900 comprises an antenna 910 coupled to a low noise amplifier 920 for amplifying a received signal. An output of the low noise amplifier 920 is coupled to a first mixer 930 where the received signal is down-converted by being mixed with a local oscillator signal generated by the frequency synthesiser (SYNTH) 800. An output of the first mixer 930 is coupled to an analogue-to-digital converter (ADC) 950 for digitising the down-converted received signal, and an output of the ADC 950 is coupled to an input 962 of a baseband processing stage (BB) 960 for further processing of the digitised down-converted received signal. The BB 960 also generates, in the digital domain, a signal to be transmitted, and has an output 968 coupled to an input of a digital-to-analogue converter (DAC) 970 for converting to the analogue domain the signal to be transmitted. An output of the DAC 970 is coupled to a second mixer 980 where the signal to be transmitted is up-converted by being mixed with a local oscillator signal generated by the frequency synthesiser (SYNTH) 800. The local oscillator signals used for down-conversion and up-conversion may have different frequencies, for example by duplication of the frequency synthesiser 800 for the different frequencies. An output of the second mixer 980 is coupled to a power amplifier 990 for amplifying the signal to be transmitted, and an output of the power amplifier 990 is coupled to the antenna 910.

FIG. 26 illustrates the tuning range that the VCO 840 can have in a wireless receiver operating in the Wideband Code Division Multiple Access (CDMA) frequency bands 1 to 7 and 22, which cover a frequency range from 869 MHz to 3600 MHz. The first column of FIG. 26 indicates the number of the frequency band, and the second and third columns show the lower and upper frequencies of the respective bands. Using a frequency synthesiser having a frequency divider restricted to division by a power of two, that is division by $2^M$ where M is an integer, the fourth column of FIG. 26 shows the value of M that can be used, and the fifth and sixth columns show the lower and upper frequencies that the VCO 840 would be required to tune between for each of the frequency bands. In this case, the total tuning range of the VCO 840 required to encompass all of the frequency bands is from 5240 MHz to 8680 MHz, that is 3440 MHz, which is 49.4% of the VCO 840 centre frequency of 6960 MHz. Using a frequency synthesiser having a frequency divider that can have a division ratio L, where L can be any integer or N.5, where N is any positive integer, the seventh column of FIG. 25 shows the value of L that can be used, and the eighth and ninth columns show the lower and upper frequencies that the VCO 840 would be required to tune between for each of the frequency bands. In this case, the total tuning range of the VCO 840 required to encompass all of the frequency bands is from 5240 MHz to 5970 MHz, that is 730 MHz, which is 13% of the VCO 840 centre frequency of 5605 MHz. Therefore, the disclosed frequency divider 100, or method of frequency division, which provides a division ratio L, where L can be any integer or N.5, where N is any positive integer, reduces the required tuning range from 49.4% to 13%, which enables an improved noise performance, reduced power consumption and reduced silicon area of an integrated circuit.

Furthermore, the use of a non-integer division ratio N.5, where N is any positive integer, ensures that harmonics of the reference oscillator 810 will not coincide with the VCO 840 frequency, which enables improved performance of the VCO 840 and improved isolation between the transmit and receive portions of the wireless communication apparatus 900.

In embodiments of the frequency divider 100 comprising a clocked delay line 144, 144', the signal at the output of each of the delay stages 143, 145, 148, 143a, 143b, 145a, 145b, 148a, 148b has the same waveform, or an inverted version of the same waveform, but delayed by different amounts, that is, different phases. Therefore, the signals at the output of different ones of the delay stages 143, 145, 148, 143a, 143b, 145a, 145b, 148a, 148b may be employed as local oscillator signals for multiphase mixers.

The disclosed frequency divider 100, or method of frequency division, also has application in communications apparatus employing a carrier aggregation technique in which a transmitter transmits simultaneously at a plurality of carrier frequencies, or a receiver receives simultaneously at a plurality of carrier frequencies. Such a transmitter or receiver may employ a plurality of VCOs 840 or DCOs for generating a plurality of carrier signals or a plurality of local oscillator signals for up-conversion or down-conversion. When the plurality of carrier frequencies are close to each other, for example in the same frequency band, there is the possibility that the plurality of VCOs 840 or DCOs can push or pull each other, resulting in spurious frequencies being generated. Such a problem can be diminished or avoided by employing the disclosed frequency divider 100, or method of frequency division, to ensure the different VCOs 840 or DCOs use different division ratios. The versatility of the disclosed frequency divider 100 and method of frequency division facilitates such a solution.

The frequency divider 100 may be configurable to implement embodiments for division by for any desired positive values of N, and any required integer division ratio. Alternatively, the frequency divider 100 may be configurable to implement only those embodiments required for a desired subset of those division ratios.

Embodiments of the frequency divider 100 having a division ratio of 1.5 which do not need to use the clocked delay line 144 for providing the division ration of 1.5 may conserve power by powering down the clocked delay line during operation with a division ratio of 1.5. Embodiments of the frequency divider 100 implementing a division ratio of N.5, for which the mode control stage 130 is required, and an integer value, may conserve power by powering down the mode control stage 130 where this is not required for operation with an integer division ratio.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present disclosure.

The invention claimed is:

1. A frequency divider comprising:
   a signal generation stage arranged to employ a clock signal at a clock frequency to provide a first reference signal and a second reference signal, the second reference signal corresponding to the first reference signal delayed by half a period of the clock signal;
   a synchronization stage arranged to generate an output signal having an output frequency divided from the clock frequency by switching between the first reference signal and the second reference signal once per cycle of the output signal; and
   a mode control stage coupled to the signal generation stage for generating a selection signal indicative of the completion of each cycle of the first reference signal, and wherein the switching between the first reference signal and the second reference signal is responsive to the selection signal.

2. A frequency divider as claimed in claim 1, wherein the mode control stage comprises a divide-by-two stage for generating the selection signal having a frequency equal to half of a frequency of the first reference signal.

3. A frequency divider as claimed in claim 1, wherein the signal generation stage comprises a division stage for generating the first reference signal by dividing the clock signal by an integer division ratio.

4. A frequency divider as claimed in claim 3, wherein the division stage is arranged to alternately increase and decrease the integer division ratio in response to the selection signal.

5. A frequency divider as claimed in claim 4, wherein the division stage comprises:
   a clocked delay line having a plurality of delay stages coupled in series;
   a feedback controller coupled between an input of the clocked delay line and outputs of one or more of the delay stages and arranged to provide a periodic input signal to the input of the clocked delay line, wherein each period of the input signal is dependent on signals at respective outputs of the one or more of the delay stages;
   an output of the clocked delay line coupled to an output of one of the delay stages for delivering the first reference signal; and
   a delay circuit coupled to the one, or another, of the delay stages for generating the second reference signal corresponding to the first reference signal delayed by half a period of the clock signal;
   wherein the feedback controller is arranged to alternately increase and decrease the integer division ratio in response to the selection signal by selecting the one or more of the delay stages from the plurality of delay stages.

6. A frequency divider as claimed in claim 4, wherein the division stage comprises:
   a clocked delay line having a plurality of delay stages coupled in series, wherein the delay stages occupying odd numbered positions in the clocked delay line are arranged to be clocked by the clock signal and the delay stages occupying even numbered positions in the clocked delay line are arranged to be clocked by an inverse clock signal corresponding to an inversion of the clock signal;

a feedback controller coupled between an input of the clocked delay line and outputs of one or more of the delay stages and arranged to provide a periodic input signal to the input of the clocked delay line, wherein each period of the input signal is dependent on signals at respective outputs of the one or more of the delay stages;

a first output of the clocked delay line coupled to an output of one of the delay stages for delivering the first reference signal; and a second output of the clocked delay line coupled to another one of the delay stages for delivering the second reference signal;

wherein the feedback controller is arranged to alternately increase and decrease the integer division ratio in response to the selection signal by selecting the one or more of the delay stages from the plurality of delay stages.

7. A frequency divider as claimed in claim 6, wherein each of the delay stages comprises a tri-state inverter circuit.

8. A frequency divider as claimed in claim 4, wherein the alternate increase and decrease of the integer division ratio in response to the selection signal is an alternate increase and decrease of the integer division ratio by unity.

9. A frequency divider as claimed in claim 5, the feedback controller comprising:

a first pair of switches comprising a first controller switch and a second controller switch coupled in parallel, a second pair of switches comprising a third controller switch and a fourth controller switch coupled in parallel, a third pair of switches comprising a fifth controller switch and a sixth controller switch coupled in parallel, and a fourth pair of switches comprising a seventh controller switch and an eighth controller switch coupled in parallel, wherein the first and second pairs of switches are coupled in a series arrangement between a first voltage rail and the input of the clocked delay line, and the third and fourth pairs of switches are coupled in a series arrangement between a second voltage rail and the input of the clocked delay line;

wherein at least one of the first, third, fifth and seventh controller switches are arranged to be switched dependent on a required division ratio of the division stage; and wherein the second, fourth, sixth and eighth controller switches are arranged to be switched dependent on respective outputs of respective delay stages of the clocked delay line.

10. A frequency divider as claimed in claim 9, wherein the first, second, third and fourth controller switches comprise n-channel metal oxide silicon, NMOS, transistors and the fifth, sixth, seventh and eighth controller switches comprise p-channel metal oxide silicon, PMOS, transistors.

11. A frequency divider as claimed in claim 4, the synchronization stage comprising:

first, third and fifth synchronization switches coupled in a series arrangement between a/the first voltage rail and the output of the frequency divider;

second, fourth and sixth synchronization switches coupled in a series arrangement between the first voltage rail and the output of the frequency divider;

seventh, ninth and eleventh synchronization switches coupled in a series arrangement between the output of the frequency divider and a/the second voltage rail;

eighth, tenth and twelfth synchronization switches coupled in a series arrangement between the output of the frequency divider and the second voltage rail;

wherein, in a first state:

the first and twelfth switches are switched in response to the selection signal;

the second and eleventh synchronization switches are switched in response to an inverse of the selection signal;

the third and tenth synchronization switches are switched in response to the clock signal;

the fourth and ninth synchronization switches are switched in response to the inverse clock signal;

the fifth and seventh synchronization switches are switched in response to the first reference signal; and the sixth and eighth synchronization switches are switched in response to the second reference signal.

12. A frequency divider as claimed in claim 11, wherein, in a second state:

the second and eleventh switches are switched in response to the selection signal;

the first and twelfth synchronization switches are switched in response to an inverse of the selection signal;

the third, ninth and tenth synchronization switches are switched in response to the clock signal;

the fourth synchronization switch is switched in response to the inverse clock signal;

the fifth, sixth and eighth synchronization switches are switched in response to the first reference signal; and the seventh synchronization switch is switched in response to the second reference signal.

13. A frequency divider as claimed in claim 11, wherein, in a second state:

the first and twelfth synchronization switches are switched in response to the selection signal;

the second and eleventh switches are switched in response to an inverse of the selection signal;

the fourth synchronization switch is switched in response to the clock signal;

the third, ninth and tenth synchronization switches are switched in response to the inverse clock signal;

the seventh synchronization switch is switched in response to the first reference signal; and the fifth, sixth and eighth synchronization switches are switched in response to the second reference signal.

14. A frequency divider as claimed in claim 11, wherein the first, second, third, fourth, fifth and sixth synchronization switches comprise n-channel metal oxide silicon, NMOS, transistors and the seventh, eighth, ninth, tenth, eleventh and twelfth synchronization switches comprise p-channel metal oxide silicon, PMOS, transistors.

15. A frequency synthesizer comprising:

a frequency divider comprising:

a signal generation stage arranged to employ a clock signal at a clock frequency to provide a first reference signal and a second reference signal, the second reference signal corresponding to the first reference signal delayed by half a period of the clock signal;

a synchronization stage arranged to generate an output signal having an output frequency divided from the clock frequency by switching between the first reference signal portion and the second reference signal once per cycle of the output signal; and a mode control stage coupled to the signal generation stage for generating a selection signal indicative of the completion of each cycle of the first reference signal, and wherein the switching between the first reference signal and the second reference signal is responsive to the selection signal.

16. A wireless communication apparatus comprising:
a frequency divider comprising:
  a signal generation stage arranged to employ a clock signal at a clock frequency to provide a first reference signal and a second reference signal, the second reference signal corresponding to the first reference signal delayed by half a period of the clock signal;
  a synchronization stage arranged to
    generate an output signal having an output frequency divided from the clock frequency by switching between the first reference signal and the second reference signal once per cycle of the output signal; and
  a mode control stage coupled to the signal generation stage for generating a selection signal indicative of the completion of each cycle of the first reference signal, and wherein the switching between the first reference signal and the second reference signal is responsive to the selection signal.

17. A method of frequency division comprising:
employing a clock signal at a clock frequency to provide a first reference signal and a second reference signal, the second reference signal corresponding to the first reference signal delayed by half a period of the clock signal;
generating an output signal having an output frequency divided from the clock frequency by switching between the first reference signal and the second reference signal once per cycle of the output signal; and
generating a selection signal indicative of the completion of each cycle of the first reference signal, and wherein the switching between the first reference signal and the second reference signal is responsive to the selection signal.

18. A frequency divider comprising:
a signal generation stage arranged to employ a clock signal at a clock frequency to provide a first reference signal and a second reference signal, the second reference signal corresponding to the first reference signal delayed by half a period of the clock signal; and
a synchronization stage arranged to:
  generate an output signal having an output frequency divided from the clock frequency by switching between the first reference signal and the second reference signal once per cycle of the output signal;
a mode control stage coupled to an output of the frequency divider for generating a selection signal indicative of the completion of each cycle of the output signal and comprising a divide-by-two stage for generating the selection signal having a frequency equal to half of the output frequency, and wherein the switching between the first reference signal and the second reference signal is responsive to the selection signal; and
wherein:
  the first reference signal is the clock signal;
  the synchronization stage is arranged to generate an intermediate signal by switching between the first reference signal and the second reference signal once per cycle of the output signal; and
  the synchronization stage comprises a division stage for generating the output signal by dividing the intermediate signal by an integer division ratio.

19. A frequency divider comprising:
a signal generation stage arranged to employ a clock signal at a clock frequency to provide a first reference signal and a second reference signal, the second reference signal corresponding to the first reference signal delayed by half a period of the clock signal; and
a synchronization stage arranged to:
  generate an output signal having an output frequency divided from the clock frequency by switching between the first reference signal and the second reference signal once per cycle of the output signal;
a mode control stage coupled to an output of the frequency divider for generating a selection signal indicative of the completion of each cycle of the output signal and comprising a divide-by-two stage for generating the selection signal having a frequency equal to half of the output frequency, and wherein the switching between the first reference signal and the second reference signal is responsive to the selection signal; and
wherein the synchronization stage comprises a first tri-state inverter for selecting the first reference signal, a second tri-state inverter for selecting the second reference signal, a third tri-state inverter for synchronizing the selecting of the first reference signal to a transition of the clock signal, and a fourth tri-state inverter for synchronizing the selecting of the second reference signal to an opposite of the clock signal.

* * * * *